US011776888B2

(12) United States Patent
Kang et al.

(10) Patent No.: US 11,776,888 B2
(45) Date of Patent: Oct. 3, 2023

(54) PACKAGE WITH A SUBSTRATE COMPRISING PROTRUDING PAD INTERCONNECTS

(71) Applicant: QUALCOMM Incorporated, San Diego, CA (US)

(72) Inventors: Kuiwon Kang, San Diego, CA (US); Hong Bok We, San Diego, CA (US); Chin-Kwan Kim, San Diego, CA (US); Milind Shah, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 91 days.

(21) Appl. No.: 17/334,610

(22) Filed: May 28, 2021

(65) Prior Publication Data

US 2022/0384328 A1    Dec. 1, 2022

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4853* (2013.01); *H01L 21/4857* (2013.01); *H01L 23/49822* (2013.01); *H01L 24/16* (2013.01); H01L 2224/16227 (2013.01); H01L 2224/16238 (2013.01)

(58) Field of Classification Search
CPC .......... H01L 23/49838; H01L 21/4853; H01L 21/4857; H01L 23/49822; H01L 24/16; H01L 2224/16227; H01L 2224/16238
See application file for complete search history.

(56) References Cited

U.S. PATENT DOCUMENTS

| | | | |
|---|---|---|---|
| 2008/0224298 A1* | 9/2008 | Corisis | H01L 25/105 257/E23.06 |
| 2010/0218986 A1* | 9/2010 | Furuta | H01L 23/49866 228/176 |
| 2015/0061143 A1 | 3/2015 | Kim et al. | |
| 2017/0018489 A1 | 1/2017 | Gandhi et al. | |
| 2017/0117252 A1* | 4/2017 | Baik | H01L 23/3128 |

OTHER PUBLICATIONS

International Search Report and Written Opinion—PCT/US2022/030899—ISA/EPO—dated Sep. 26, 2022.

* cited by examiner

*Primary Examiner* — Selim U Ahmed
*Assistant Examiner* — Evan G Clinton
(74) *Attorney, Agent, or Firm* — Michelle Gallardo

(57) ABSTRACT

A package comprising a substrate and an integrated device coupled to the substrate. The substrate includes at least one dielectric layer, a plurality of interconnects comprising a plurality of protruding pad interconnects, and a solder resist layer located over the at least one dielectric layer, the solder resist layer comprising a thickness that is greater than a thickness of the plurality of protruding pad interconnects. A protruding pad interconnect may include a first pad portion and a second pad portion.

34 Claims, 23 Drawing Sheets

PROFILE CROSS SECTIONAL VIEW

PROFILE CROSS SECTIONAL VIEW

PROFILE CROSS SECTIONAL VIEW

FIG. 6 PROFILE CROSS SECTIONAL VIEW

US 11,776,888 B2

PACKAGE WITH A SUBSTRATE COMPRISING PROTRUDING PAD INTERCONNECTS

FIELD

Various features relate to packages that include an integrated device, but more specifically to a package that includes an integrated device and a substrate.

BACKGROUND

Packages can include a substrate and an integrated device. The substrate may include a plurality of interconnects. The integrated device may be coupled to interconnects of the substrate. There is an ongoing need to provide smaller packages with finer interconnects between the substrate and the integrated device.

SUMMARY

Various features relate to packages that include an integrated device, but more specifically to a package that includes an integrated device and a substrate.

One example provides a package comprising a substrate and an integrated device coupled to the substrate. The substrate includes at least one dielectric layer, a plurality of interconnects comprising a plurality of protruding pad interconnects, and a solder resist layer located over the at least one dielectric layer, the solder resist layer comprising a thickness that is greater than a thickness of the plurality of protruding pad interconnects.

Another example provides an apparatus comprising a substrate. The substrate includes at least one dielectric layer, a plurality of interconnects comprising a plurality of protruding pad interconnects, and a solder resist layer located over the at least one dielectric layer, the solder resist layer comprising a thickness that is greater than a thickness of the plurality of protruding pad interconnects.

Another example provides a method for fabricating a package. The method provides a substrate comprising at least one dielectric layer; a plurality of interconnects comprising a plurality of protruding pad interconnects; and a solder resist layer located over the at least one dielectric layer, the solder resist layer comprising a thickness that is greater than a thickness of the plurality of protruding pad interconnects. The method couples an integrated device to the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and an integrated device coupled to the substrate. The substrate includes at least one dielectric layer, a plurality of interconnects comprising a plurality of protruding pad interconnects, and a solder resist layer located over the at least one dielectric layer, the solder resist layer comprising a thickness that is greater than a thickness of the plurality of protruding pad interconnects. A protruding pad interconnect may include a first pad portion (e.g., bottom portion) and a second pad portion (e.g., top portion), where the first pad portion has a first width that is different than a second width of the second pad portion. The solder resist layer may have an opening over a protruding pad interconnect. In some implementations, the opening width may about equal to a width of a top portion of the protruding pad interconnect. In some implementations, the opening width may be greater than a width of the top portion of the protruding pad interconnect, and less than a width of a bottom portion of the protruding pad interconnect. The substrate may include an embedded trace substrate (ETS) or a cored substrate. The use of the protruding pad interconnects may help provide finer pitch interconnects in a substrate, while still providing reliable coupling for integrated devices. The use of the protruding pad interconnects may help provide high density interconnects between two or more integrated devices coupled to a substrate. The use of the protruding pad interconnects may help provide smaller packages.

Figure 1:
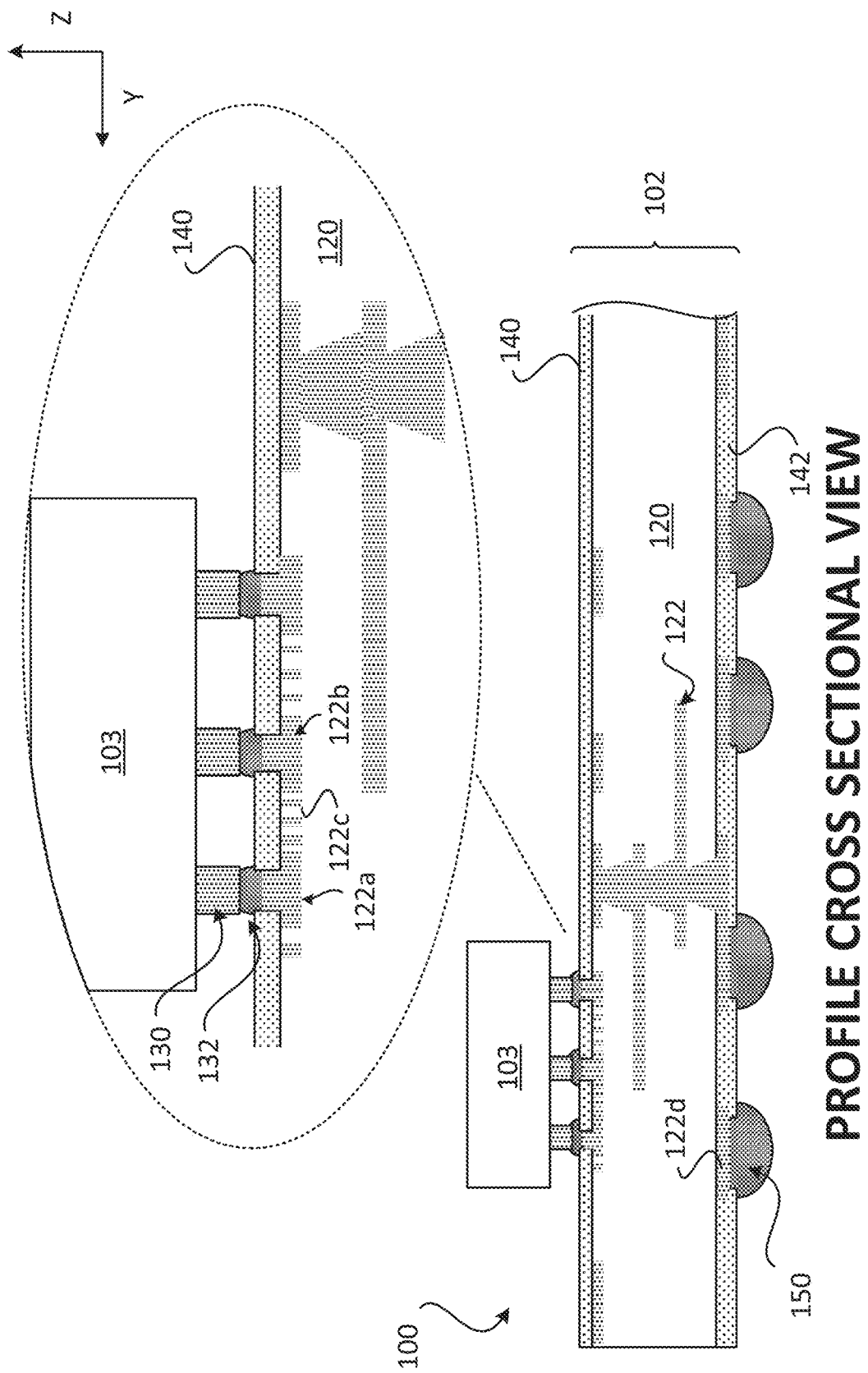
FIG. 1 illustrates a profile cross sectional view of a package that includes an integrated device and a substrate with protruding pad interconnects.

Exemplary Package Comprising a Substrate Comprising Protruding Pad Interconnects FIG. 1 illustrates a profile cross sectional view of a package 100 that includes a substrate with protruding pad interconnects. The package 100 includes a substrate 102, an integrated device 103. The substrate 102 includes at least one dielectric layer 120, a plurality of interconnects 122, a solder resist layer 140, and a solder resist layer 142.

The plurality of interconnects 122 includes a plurality of protruding pad interconnects (e.g., 122a, 122b). As will be further described below, the plurality of protruding pad interconnects includes a first protruding pad interconnect (e.g., 122a) comprising a first pad portion and a second pad portion that is coupled to a first pad portion. In some implementations, the first pad portion and the second pad portion may be considered part of the same pad. In some implementations, there may or may not be an interface between the first pad portion and the second pad portion. The solder resist layer 140 may have a thickness that is greater than the overall thickness of the plurality of protruding pad interconnects (e.g., 122a, 122b). The plurality of protruding pad interconnects may include a second protruding pad interconnect (e.g., 122b) comprising a third pad and a fourth pad that is coupled to the third pad. In some implementations, the third pad and the fourth pad may be considered part of the same pad.

As will be further described below, a protruding pad interconnect may include a first portion (e.g., bottom portion) and a second portion (e.g., top portion), where the first portion has a first width that is different than a second width of the second portion. The first pad portion of a protruding pad interconnect may be a first pad. The second pad portion of a protruding pad interconnect may be a second pad. The solder resist layer may have an opening over a protruding pad interconnect. In some implementations, the opening width (e.g., width of an opening) may about equal to a width of a top portion of the protruding pad interconnect. In some implementations, the opening width may be greater than a width of the top portion of the protruding pad interconnect, and less than a width of a bottom portion of the protruding pad interconnect.

The integrated device 103 is coupled to a first surface (e.g., top surface) of the substrate 102. For example, the integrated device 103 is coupled to the substrate 102 through a plurality of pillar interconnects 130 and a plurality of solder interconnects 132. The integrated device 103 is coupled to a plurality of protruding pad interconnects (e.g., 122a, 122b) through the plurality of pillar interconnects 130 and the plurality of solder interconnects 132.

As shown in FIG. 1, the solder resist layer 140 is located over the first surface (e.g., top surface) of the substrate 102, and the solder resist layer 142 is located over a second surface (e.g., bottom surface) of the substrate 102. The plurality of interconnects 122 may be located in the at least one dielectric layer 120. The plurality of interconnects 122 includes a plurality of protruding pad interconnects (e.g., 122a, 122b), the plurality of interconnects 122c and an interconnect 122d. The interconnect 122d may be a surface interconnect. The interconnect 122d may be located over the second surface (e.g., bottom surface) of the substrate 102. For example, the interconnect 122d may be located over the second surface (e.g., bottom surface) of the at least one dielectric layer 120. The plurality of interconnects 122c is embedded in the first surface of the substrate 102. The plurality of interconnects 122c may include a trace that is embedded in the first surface of the at least one dielectric layer 120. The plurality of interconnects 122c may include a trace that is located in the at least one dielectric layer 120 of the substrate 102. The substrate 102 may include an embedded trace substrate (ETS).

As mentioned above, the plurality of protruding pad interconnects may include a first protruding pad interconnect 122a and a second protruding pad interconnects 122b. The first protruding pad interconnect 122a may be adjacent to the second protruding pad interconnect 122b. There may be several interconnects 122c located between the first protruding pad interconnect 122a and the second protruding pad interconnects 122b. The first protruding pad interconnect 122a and the second protruding pad interconnects 122b are adjacent protruding pad interconnects because there is no other protruding pad interconnects between the first protruding pad interconnect 122a and the second protruding pad interconnects 122b. It is noted that adjacent and/or neighboring protruding pad interconnects may have other types of interconnects between them and still be considered adjacent and/or neighboring protruding pad interconnects.

Figure 2:
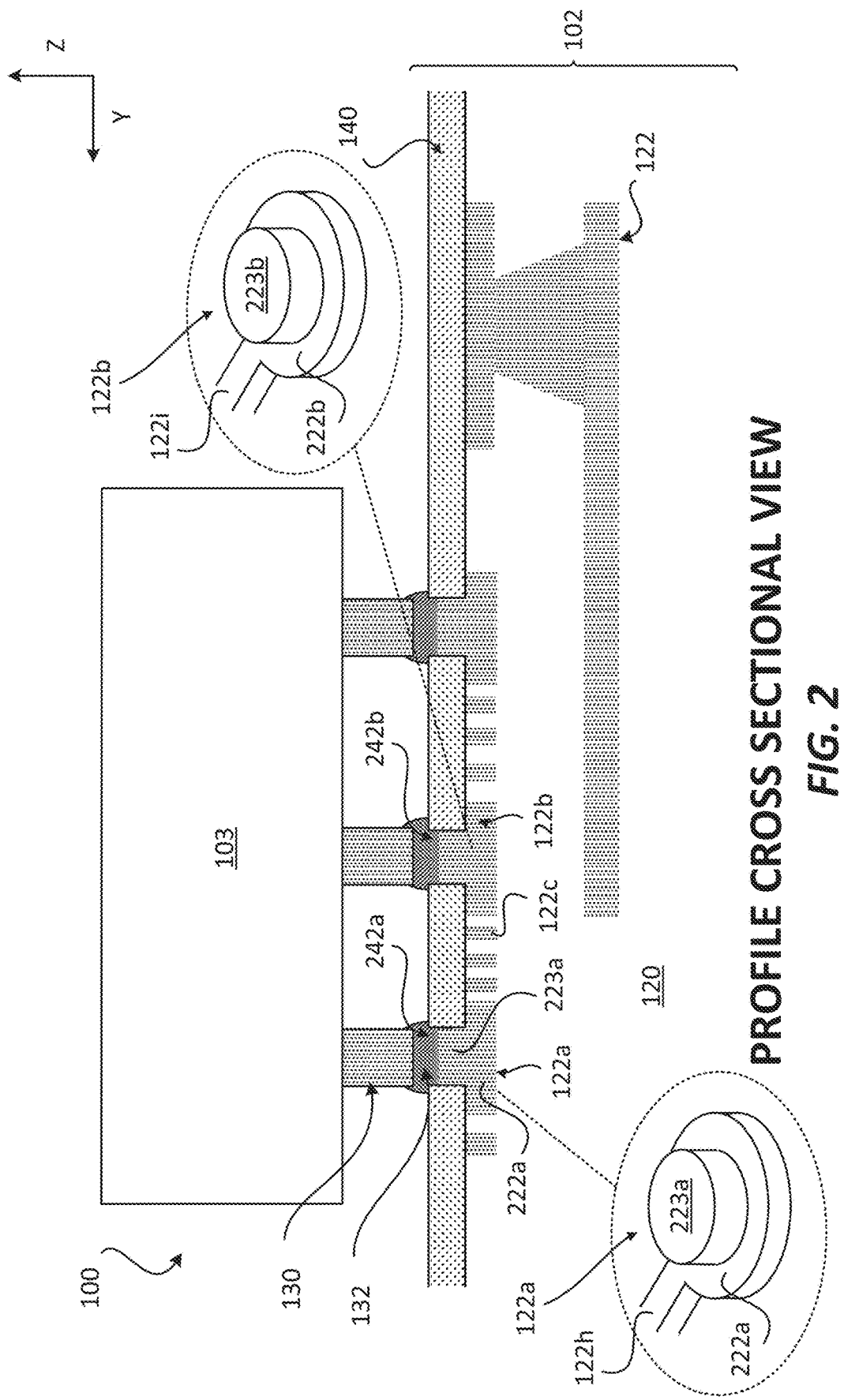
FIG. 2 illustrates a profile cross sectional close up view of a package that includes an integrated device and a substrate with protruding pad interconnects.

FIG. 2 illustrates a close-up profile cross sectional view of the package 100 that includes the substrate 102 and the integrated device 103. As shown in FIG. 2, the plurality of protruding pad interconnects may include the first protruding pad interconnect 122a and the second protruding pad interconnect 122b. The first protruding pad interconnect 122a is embedded through the first surface (e.g., top surface) of the substrate 102. The first protruding pad interconnect 122a includes a first portion 222a and a second portion 223a. The first portion 222a may include a first pad portion and the second portion 223a may include a second pad portion. The first pad portion may be coupled to the second pad portion. In some implementations, the first portion 222a and the second portion 223a may be part of the same pad (e.g., protruding pad interconnect). In some implementations, there may or may not be an interface between the first portion 222a (e.g., first pad portion) and the second portion 223a (e.g., second pad portion). The first portion 222a is located (e.g., embedded) in the at least one dielectric layer 120. The second portion 223a is located over the at least one dielectric layer 120. The first portion 222a may include a first width, and the second portion 223a may include a second width. A width may include a diameter. The first width of the first portion 222a may be different than the second width of the second portion 223a. In FIG. 2, the first width of the first portion 222a is greater than the second width of the second portion 223a. However, the second width may be greater than the first width. In some implementations, the first width may be the same as the second width. The first protruding pad interconnect 122a is coupled to the interconnect 122h. The interconnect 122h is coupled to the first portion 222a. The interconnect 122h may be a trace that is located in the at least one dielectric layer 120. There is an opening 242a in the solder resist layer 140. The opening 242a is located over the first protruding pad interconnect 122b. The opening 242a has an opening width that is about equal to the width of the second portion 223a. The opening 242a has an opening width that is less than the width of the first portion 222a. The opening 242a only exposes the second portion 223a.

As also shown in FIG. 2, the second protruding pad interconnect 122b is embedded through the first surface of the substrate 102. The second protruding pad interconnect 122b includes a first portion and a second portion, as described for the first protruding pad interconnect 122a. For example, the second protruding pad interconnect 122b may include a first portion 222b and a second portion 223b. The first portion 222b may include a first pad portion and the second portion 223b may include a second pad portion. The first pad portion may be coupled to the second pad portion. In some implementations, the first portion 222b and the second portion 223b may be part of the same pad (e.g., protruding pad interconnect). In some implementations, there may or may not be an interface between the first portion 222b (e.g., first pad portion) and the second portion 223b (e.g., second pad portion). The first portion 222b is located (e.g., embedded) in the at least one dielectric layer 120. The second portion 223b is located over the at least one dielectric layer 120. The first portion 222b may include a first width, and the second portion 223b may include a second width. A width may include a diameter. The first width may be different than the second width. In FIG. 2, the first width of the first portion 222b is greater than the second width of the second portion 223b. The second protruding pad interconnect 122b is coupled to the interconnect 122i. The interconnect 122i is coupled to the first portion 222b. The interconnect 122i may be a trace that is located in the at least one dielectric layer 120. There is an opening 242b in the solder resist layer 140. The opening 242b is located over the second protruding pad interconnect 122b. The opening 242b has an opening width that is about equal to the width of the second portion 223b. The opening 242b has an opening width that is less than the width of the first portion 222b. The opening 242b only exposes the second portion 223b.

The second portions 223a and/or 223b may be protruding portions of an interconnect. That is, the second portions 223a and/or 223b may protrude from the at least one dielectric layer 120. The second portions 223a and 223b (e.g., second pad) may include a seed layer. In some implementations, the minimum pitch between two adjacent protruding pad interconnects (e.g., with three traces in between the adjacent protruding pad interconnects) configured to couple to pillar interconnects is about 80 micrometers. For example, the minimum pitch between the protruding pad interconnects 122a and 122b may be about 80 micrometers. The plurality of protruding pad interconnects may have different widths. For example, the first portion (e.g., 222a, 222b) of a protruding pad interconnect may have a width in a range of about 40-48 micrometers. The second portion (e.g., 223a, 223b) of a protruding pad interconnect may have a width in a range of about 10-40 micrometers. In some implementations, the second portion (e.g., 223a, 223b) of a protruding pad interconnect may have a thickness in a range of about 5-15 micrometers.

There are several technical advantages to the configuration shown in at least FIG. 2. One, the protruding pad interconnects help decrease the pitch between interconnects for easy signal routing without reducing signal traces, thus more interconnects may be provided in a given region. Two, the protruding portions of the protruding pad interconnect (e.g., 122a) and having a solder resist layer that is thicker than the protruding pad interconnect may help limit solder interconnect spreading into adjacent traces, thus reducing the risk of shorting. As will be further described below, the use of a solder resist layer with openings that are greater than width of the protruding portion of the protruding pad interconnects may further reduce the likelihood of shorting due to solder interconnect spreading. Similar technical advantages are also found in the other substrates described in the disclosure.

FIG. 2 illustrates a solder resist layer 140 that includes openings over the plurality of protruding pad interconnects. The size and/or shape of the openings in the solder resist layer 140 may vary with different implementations. In some implementations, the width of an opening in the solder resist layer 140 may be equal or less than the width of the protruding pad interconnect over which the opening is located. In some implementations, the width of an opening in the solder resist layer 140 may only expose the second portion of a protruding pad interconnect over which the opening is located. The solder resist layer 140 includes a first opening 242a located over the protruding pad interconnect 122a. The solder resist layer 140 also includes a second opening 242b located over the protruding pad interconnect 122b. The first opening 242a may only expose the second portion 223a of the protruding pad interconnect 122a. The first opening 242a may have a width that is equal or less than the width of the first portion 222a of the protruding pad interconnect 122a. The second opening 242b may only expose the second portion 223b of the protruding pad interconnect 122b. The second opening 242b may have a width that is equal or less than the width of the first portion 222b of the protruding pad interconnect 122b.

As shown in FIG. 2, the package 100 includes the integrated device 103 and the substrate 102. The integrated device 103 is coupled to a first surface (e.g., top surface) of the substrate 102. For example, the integrated device 103 is coupled to the substrate 102 through a plurality of pillar interconnects 130 and a plurality of solder interconnects 132. The integrated device 103 is coupled to a plurality of protruding pad interconnects (e.g., 122a, 122b) through the plurality of pillar interconnects 130 and the plurality of solder interconnects 132. Although not shown, the package 100 may include a second integrated device that is coupled to the substrate 102. As will be further described below in at least FIG. 7, the integrated device 103 (e.g., first integrated device) may be coupled (e.g., electrically coupled) to a second integrated through the plurality of pad interconnects (e.g., 122a, 122b) and the interconnects 122c.

Figure 3:
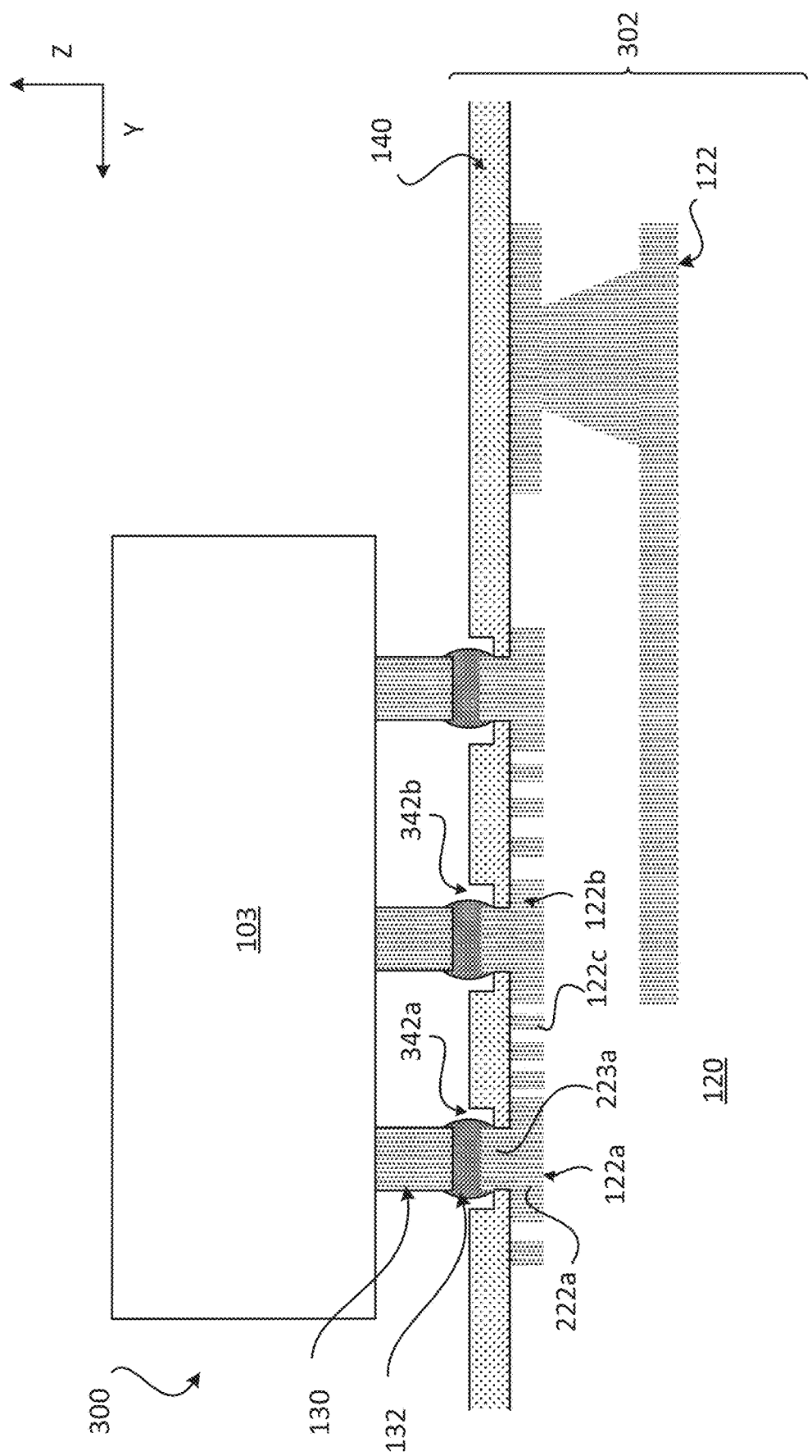
FIG. 3 illustrates a profile cross sectional close up view of a package that includes an integrated device and a substrate with protruding pad interconnects.

FIG. 3 illustrates a substrate 302. The substrate 302 is similar to the substrate 102 of FIGS. 1 and 2, thus includes similar components as the substrate 102. As shown in FIG. 3, the substrate 102 includes the solder resist layer 140 located over the first surface of the substrate 302 (e.g., located over a first surface of the at least one dielectric layer 120). The solder resist layer 140 may include solder resist layer portions with different thicknesses and/or openings with different sizes. The solder resist layer 140 includes a first opening 342a located over the protruding pad interconnect 122a. The solder resist layer 140 also includes a second opening 342b located over the protruding pad interconnect 122b. The first opening 342a may expose the second portion 223a of the protruding pad interconnect 122a. The first opening 342a may have a width that is equal or less than the width of the first portion 222a of the protruding pad interconnect 122a. The first opening 342a may have a width that is greater than the width of the second portion 223a of the protruding pad interconnect 122a. The second opening 342b may expose the second portion 223b of the protruding pad interconnect 122b. The second opening 342b may have a width that is equal or less than the width of the first portion 222b of the protruding pad interconnect 122b. The second opening 342b may have a width that is greater than the width of the second portion 223b of the protruding pad interconnect 122b. The opening 342a and the opening 342b create a space that helps prevent solder from overflowing into nearby interconnects, thus helping prevent shorting.

As shown in FIG. 3, the package 300 includes the integrated device 103 and the substrate 302. The integrated device 103 is coupled to a first surface (e.g., top surface) of the substrate 302, in a similar manner as described for the package 100.

The integrated device (e.g., 103) may include a die (e.g., semiconductor bare die). The integrated device may include a power management integrated circuit (PMIC). The integrated device may include an application processor. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103) may include at least one electronic circuit (e.g., first electronic circuit, second electronic circuit, etc. . . . ).

The substrate may have different numbers of metal layers (e.g., 10 metal layers). Different implementations may use different substrates. The substrates (e.g., 102, 302) may include an embedded trace substrate (ETS). The at least one dielectric layer 120 may include prepreg. An example of fabricating a substrate is further described below in FIGS. 14A-104C.

In some implementations, a substrate (e.g., 402, 602) may include a cored substrate. In some implementations, a substrate may be fabricated using a modified semi-additive process (mSAP) or a semi-additive process (SAP). An example of fabricating a substrate is further described below in FIGS. 12A-12C.

Figure 4:
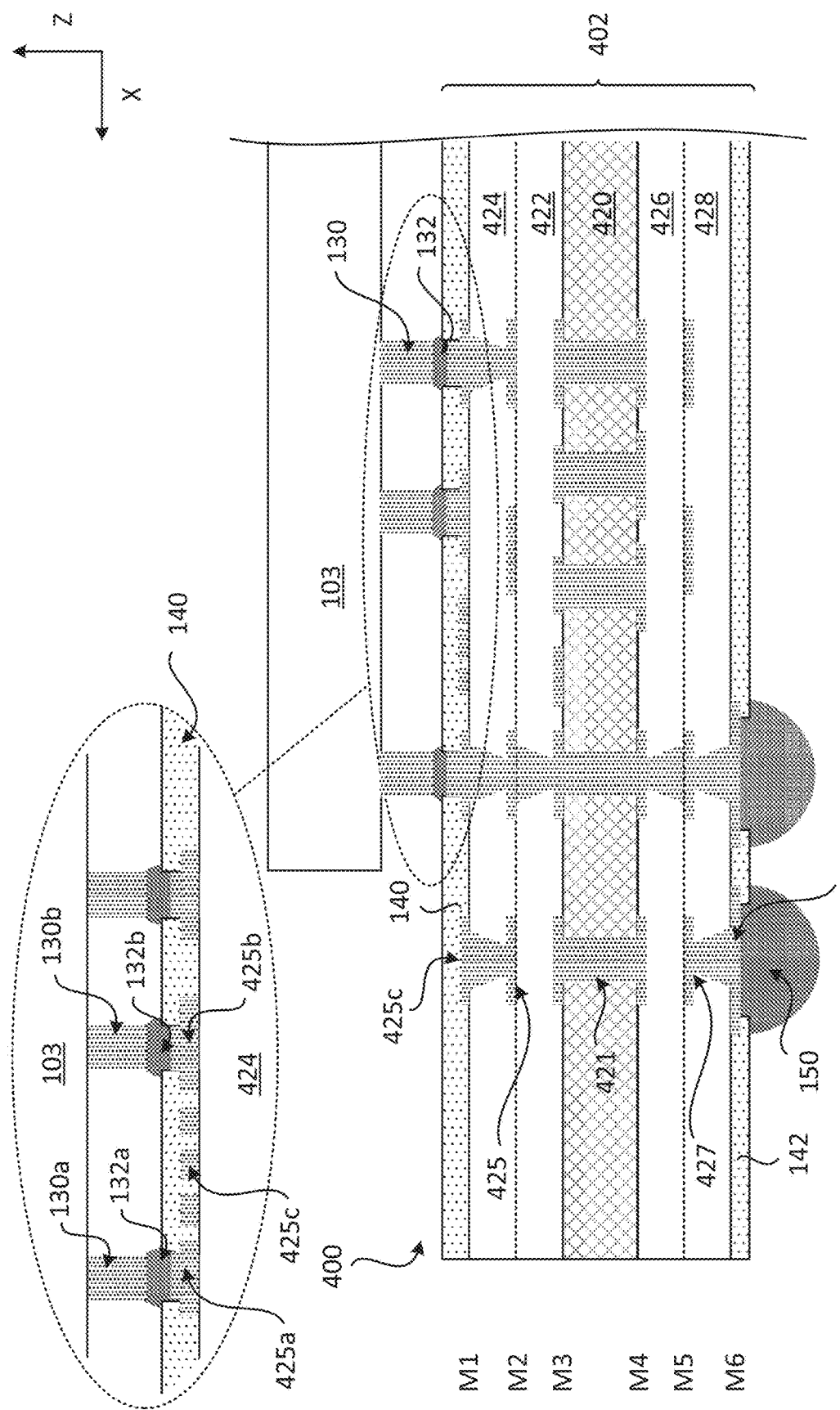
FIG. 4 illustrates a profile cross sectional view of another package that includes an integrated device and a substrate with protruding pad interconnects.

FIG. 4 illustrates a package 400 that includes a substrate 402 and the integrated device 103. The integrated device 103 is coupled to a first surface (e.g., top surface) of the substrate 402 through the plurality of pillar interconnects 130 and/or the plurality of solder interconnects 132. The substrate 402 may be a cored substrate.

The substrate 402 may be a laminated substrate that includes a core layer. The substrate 402 includes a core layer 420, at least one first dielectric layer (e.g., 422, 424), at least one second dielectric layer (e.g., 426, 428), the solder resist layer 140, the solder resist layer 142, a plurality of core interconnects 421, a plurality of interconnects 425 and a plurality of interconnects 427. The plurality of solder interconnects 132 may be coupled to the substrate 402 through the plurality of interconnects 425.

The core layer 420 may include glass or glass fiber with resin. However, the core layer 420 may include different materials. The dielectric layers 422, 424, 426 and/or 428 may each include prepreg (e.g., a prepreg layer). The dielectric layers 422, 424, 426 and/or 428 may be build up layers. The dielectric layers 422, 424, 426 and/or 428 may include a different material than the core layer 420. The dielectric layers 422 and 424 may be considered as one dielectric layer. The dielectric layers 426 and 428 may be considered as one dielectric layer. As will be further described below, different implementations may have different numbers of dielectric layers and/or different numbers of metal layers. FIG. 4 illustrates a substrate that includes 6 metal layers (e.g., M1, M2, M3, M4, M4, M5, M6). However, a substrate may include more or less metal layers and/or more or less dielectric layers. For example, a substrate may include 10 metal layers.

Some of the interconnects from the plurality of interconnects 425 may be located in the dielectric layers 422 and/or 424. Some of the interconnects from the plurality of interconnects 425 may be located over a surface of the dielectric layer 424. The plurality of interconnects 425 includes a plurality of protruding pad interconnects (e.g., 425a, 425b) and a plurality of interconnects 425c (e.g., traces). The core layer 420 includes a first surface and a second surface. The at least one first dielectric layer (e.g., 422, 424) is located over the first surface of the core layer 420. The at least one second dielectric layer (e.g., 426, 428) is located over the second surface of the core layer 420. The plurality of protruding pad interconnects (e.g., 425a, 425b) and the plurality of interconnects 425c are located over a surface of the at least one first dielectric layer 424. The solder resist layer 140 is located over the surface of the at least one first dielectric layer 424. The plurality of protruding pad interconnects (e.g., 425a, 425b) and the plurality of interconnects 425c may be located on the same metal layer (e.g., M1) of the substrate 402. The solder resist layer 140 includes thickness that is greater than the thickness of the plurality of protruding pad interconnects (e.g., 425a, 425b).

As mentioned above, the integrated device 103 is coupled to a first surface (e.g., top surface) of the substrate 102 through the plurality of pillar interconnects 130 and/or the plurality of solder interconnects 132. The plurality of pillar interconnects 130a is coupled to the plurality of solder interconnects 132a. The plurality of solder interconnects 132a is coupled to the protruding pad interconnect 425a. The plurality of pillar interconnects 130b is coupled to the plurality of solder interconnects 132b. The plurality of solder interconnects 132b is coupled to the protruding pad interconnect 425b. The plurality of solder interconnects 150 is coupled to the plurality of interconnects 427d.

Figure 5:
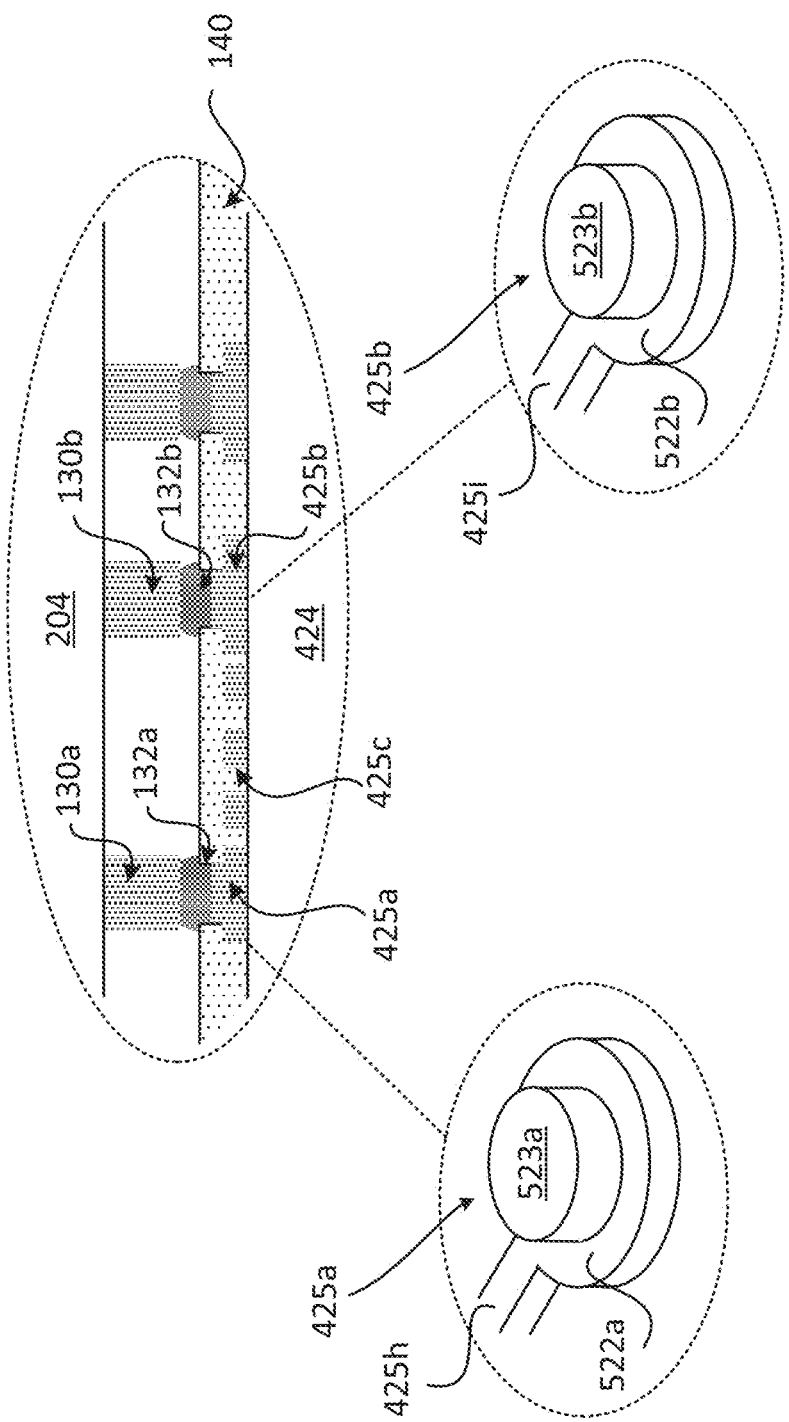
FIG. 5 illustrates a profile cross sectional close up view of a package that includes an integrated device and a substrate with protruding pad interconnects.

FIG. 5 illustrates a close-up profile cross sectional view of the package 400 that includes the substrate 402 and the integrated device 103. As shown in FIG. 5, the plurality of protruding pad interconnects may include a first protruding pad interconnect 425a and a second protruding pad interconnect 425b. The first protruding pad interconnect 425a is located above the first surface (e.g., top surface) of the substrate 402 (e.g., above the dielectric layer 424). The first protruding pad interconnect 425a includes a first portion 522a and a second portion 523a. The first portion 522a may include a first pad portion and the second portion 523a may include a second pad portion. The first pad portion may be coupled to the second pad portion. In some implementations, the first portion 522a and the second portion 523a may be part of the same pad (e.g., protruding pad interconnect). In some implementations, there may or may not be an interface between the first portion 522a (e.g., first pad portion) and the second portion 523a (e.g., second pad). The first portion 522a and the second portion 523a are located over the at least one dielectric layer 424. The first portion 522a may include a first width, and the second portion 523a may include a second width. A width may include a diameter. The first width of the first portion 522a may be different than the second width of the second portion 523a. In FIG. 5, the first width of the first portion 522a is greater than the second width of the second portion 523a. However, the second width may be greater than the first width. In some implementations, the first width may be the same as the second width. The first protruding pad interconnect 425a is coupled to the interconnect 425h. The interconnect 425h is coupled to the first portion 522a. The interconnect 425h may be a trace that is located in the at least one dielectric layer 424. There is an opening in the solder resist layer 140 over the first protruding pad interconnect 425a. The width of the opening is about equal to the width of the second portion 523a of the first protruding pad interconnect 425a. The opening exposes the second portion 523a of the first protruding pad interconnect 425a.

The second protruding pad interconnect 425b may be adjacent to the first protruding pad interconnect 425a. The second protruding pad interconnect 425b is located above the first surface (e.g., top surface) of the substrate 402 (e.g., above the dielectric layer 424). The second protruding pad interconnect 425b includes a first portion 522b and a second portion 523b. The first portion 522b may include a first pad portion and the second portion 523b may include a second pad portion. The first pad portion may be coupled to the second pad portion. In some implementations, the first portion 522b and the second portion 523b may be part of the same pad (e.g., protruding pad interconnect). In some implementations, there may or may not be an interface between the first portion 522b (e.g., first pad portion) and the second portion 523b (e.g., second pad portion). The first portion 522b and the second portion 523b are located over the at least one dielectric layer 424. The first portion 522b may include a first width, and the second portion 523b may include a second width. A width may include a diameter. The first width of the first portion 522b may be different than the second width of the second portion 523b. In FIG. 5, the first width of the first portion 522b is greater than the second width of the second portion 523b. However, the second width may be greater than the first width. In some implementations, the first width may be the same as the second width. The second protruding pad interconnect 425b is coupled to the interconnect 425i. The interconnect 425i is coupled to the first portion 522b. The interconnect 425i may be a trace that is located in the at least one dielectric layer 424. There is an opening in the solder resist layer 140 over the second protruding pad interconnect 425b. The width of the opening is about equal to the width of the second portion 523b of the second protruding pad interconnect 425b. The opening exposes the second portion 523b of the second protruding pad interconnect 425b.

Figure 6:
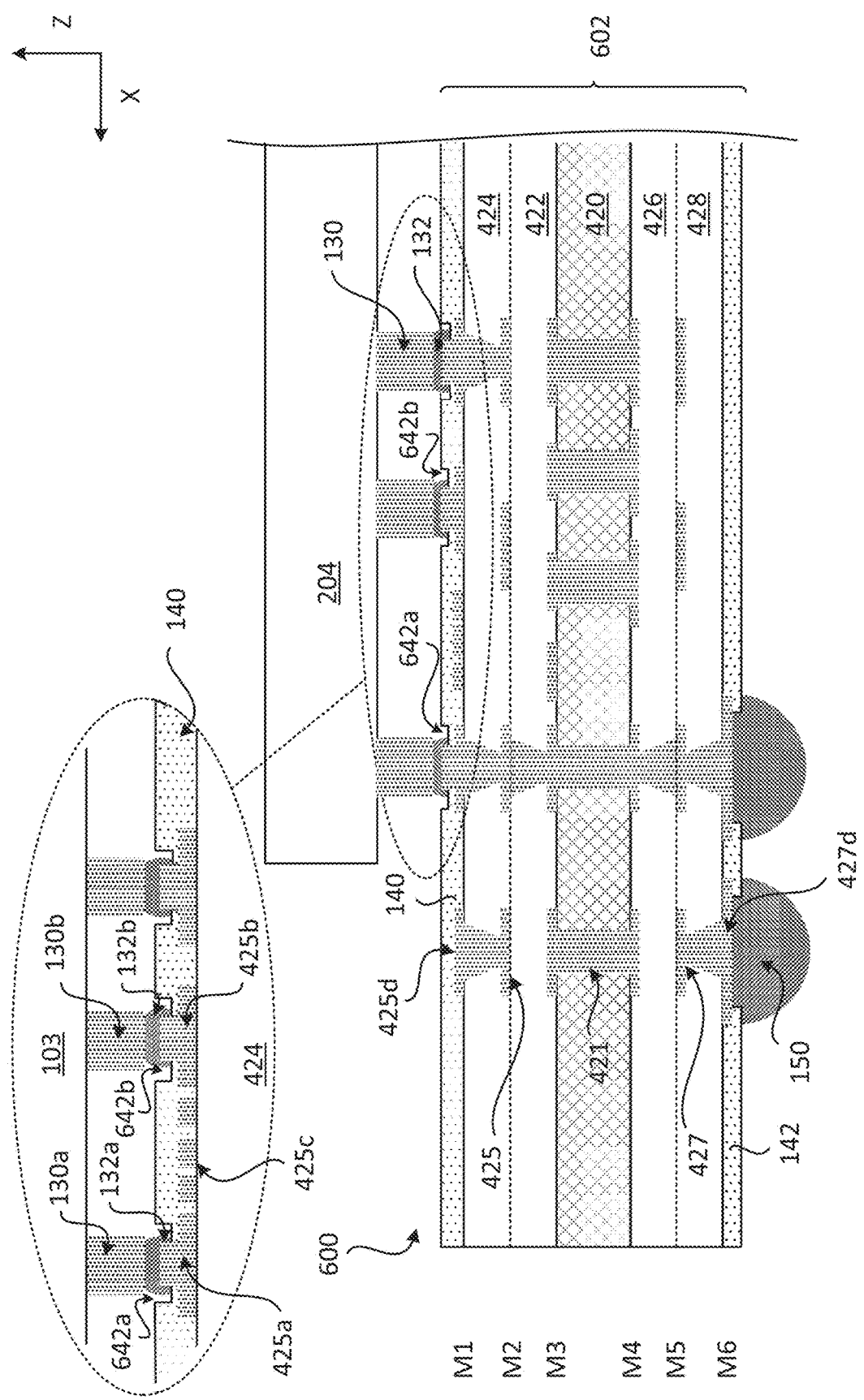
FIG. 6 illustrates a profile cross sectional view of another package that includes an integrated device and a substrate with protruding pad interconnects.

FIG. 6 illustrates a package 600 that includes the substrate 602 and the integrated device 103. The substrate 602 of FIG. 6 is similar to the substrate 402 of FIG. 4, and thus includes similar components as the substrate 102. As shown in FIG. 6, the substrate 402 includes the solder resist layer 140 located over the first surface of the substrate 402 (e.g., located over a first surface of the dielectric layer 424). The solder resist layer 140 may include solder resist layer portions with different thicknesses and/or openings with different sizes. The solder resist layer 140 includes a first opening 642a located over the protruding pad interconnect 425a. The solder resist layer 140 also includes a second opening 642b located over the protruding pad interconnect 425b. The first opening 642a may expose the second portion 523a of the protruding pad interconnect 425a. The first opening 642a may have a width that is equal or less than the width of the first portion 522a of the protruding pad interconnect 425a. The second opening 642b may expose the second portion 523b of the protruding pad interconnect 425b. The second opening 642b may have a width that is equal or less than the width of the first portion 522b of the protruding pad interconnect 425b.

Referring to FIG. 6 in conjunction with FIG. 5, the first opening 642a may have a width that is equal or less than the width of the first portion 522a of the protruding pad interconnect 425a. The first opening 642a may have a width that is greater than the width of the second portion 523a of the protruding pad interconnect 425a. The second opening 642b may expose the second portion 523b of the protruding pad interconnect 425b. The second opening 642b may have a width that is equal or less than the width of the first portion 522b of the protruding pad interconnect 425b. The second opening 642b may have a width that is greater than the width of the second portion 523b of the protruding pad interconnect 425b. The opening 642a and the opening 642b create a space that helps prevent solder from overflowing into nearby interconnects, thus helping prevent shorting.

The plurality of protruding pad interconnects may have different widths. For example, the first portion (e.g., 522a, 522b) of a protruding pad interconnect may have a width in a range of about 40-48 micrometers. The second portion (e.g., 523a, 523b) of a protruding pad interconnect may have a width in a range of about 10-40 micrometers. In some implementations, the second portion (e.g., 523a, 523b) of a protruding pad interconnect may have a thickness in a range of about 5-15 micrometers.

Figure 7:
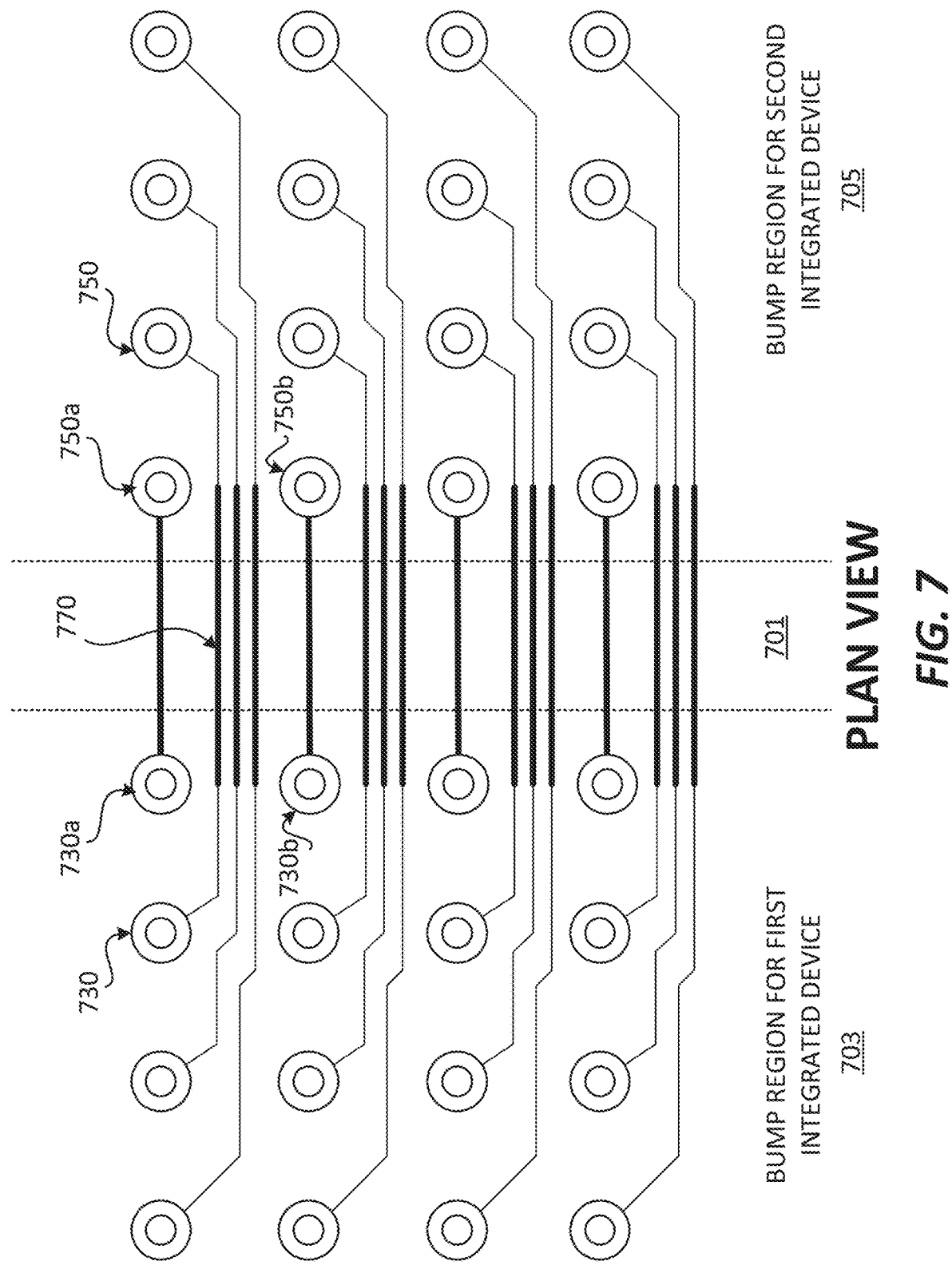
FIG. 7 illustrates a plan view of a package that includes a substrate and several integrated devices coupled to the substrate through protruding pad interconnects.

FIG. 7 illustrates a plan view of a substrate 701 that includes a plurality of protruding pad interconnect. The substrate 701 may represent any of the substrates (e.g., 102, 302, 402, 602) described in the disclosure. The substrate 701 includes a first plurality of protruding pad interconnects 730, a second plurality of protruding pad interconnects 750 and a plurality of interconnects 770. The first plurality of protruding pad interconnects 730 may represent any of the protruding pad interconnects (e.g., 122a, 122b, 425a, 425b) described in the disclosure. The second plurality of protruding pad interconnects 750 may represent any of the protruding pad interconnects (e.g., 122a, 122b, 425a, 425b) described in the disclosure. The plurality of interconnects 770 may represent interconnects (e.g., 122c, 425c) located between two adjacent and/or two neighboring protruding pad interconnects. A first integrated device (e.g., 103) may be configured to be coupled to the substrate 701 through the first plurality of protruding pad interconnects 730. The first plurality of protruding pad interconnects 730 may be part of a first bump region 703 of the substrate 701 for a first integrated device. A second integrated device (e.g., 103) may be configured to be coupled to the substrate 701 through the second plurality of protruding pad interconnects 750. The second plurality of protruding pad interconnects 750 may be part of a first bump region 705 of the substrate 701 for a second integrated device. The first integrated device and the second integrated device may be configured to be electrically coupled through the first plurality of protruding pad interconnects 730, the second plurality of protruding pad interconnects 750 and the plurality of interconnects 770. A minimum pitch between two adjacent protruding pads (e.g., 730a, 730b) from the first plurality of protruding pad interconnects 730 may be about 80 micrometers. Similarly, a minimum pitch between two adjacent protruding pads (e.g., 750a, 750b) from the second plurality of protruding pad interconnects 750 may be about 80 micrometers. Despite having a minimum pitch of about 80 micrometers between adjacent protruding pad interconnects, it is possible to have at least three interconnects (e.g., three traces, three escape interconnects) located between the two adjacent protruding pad interconnects without concerns for shorting. This configuration helps provide high speed communication between two integrated devices by allowing higher density interconnects between the integrated devices.

Having described various substrates with protruding pad interconnects, sequences and methods for fabricating substrates with protruding pad interconnects will now be described below.

Figure 8:
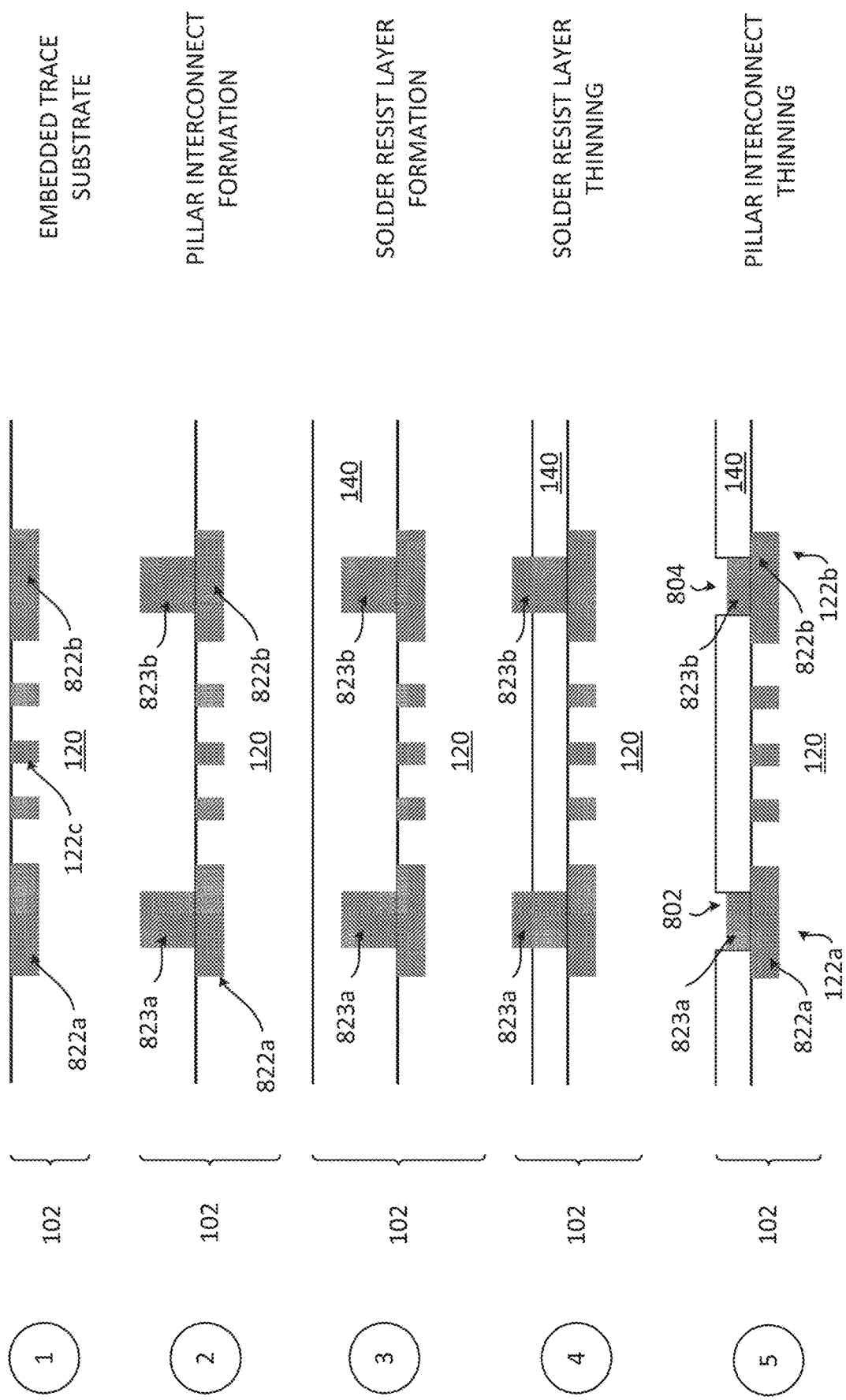
FIG. 8 illustrates an exemplary sequence for fabricating an embedded trace substrate with protruding pad interconnects.

Exemplary Sequences for Fabricating a Substrate Comprising Protruding Pad Interconnects In some implementations, fabricating a substrate includes several processes. FIG. 8 illustrates an exemplary sequence for providing or fabricating a substrate that includes protruding pad interconnects. In some implementations, the sequence of FIG. 8 may be used to provide or fabricate the substrate 102 of FIGS. 1-3. However, the process of FIG. 8 may be used to fabricate other substrates described in the disclosure. The sequence of FIG. 8 may be used in conjunction with the sequence of FIGS. 14A-14C.

It should be noted that the sequence of FIG. 8 may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Figure 14A:
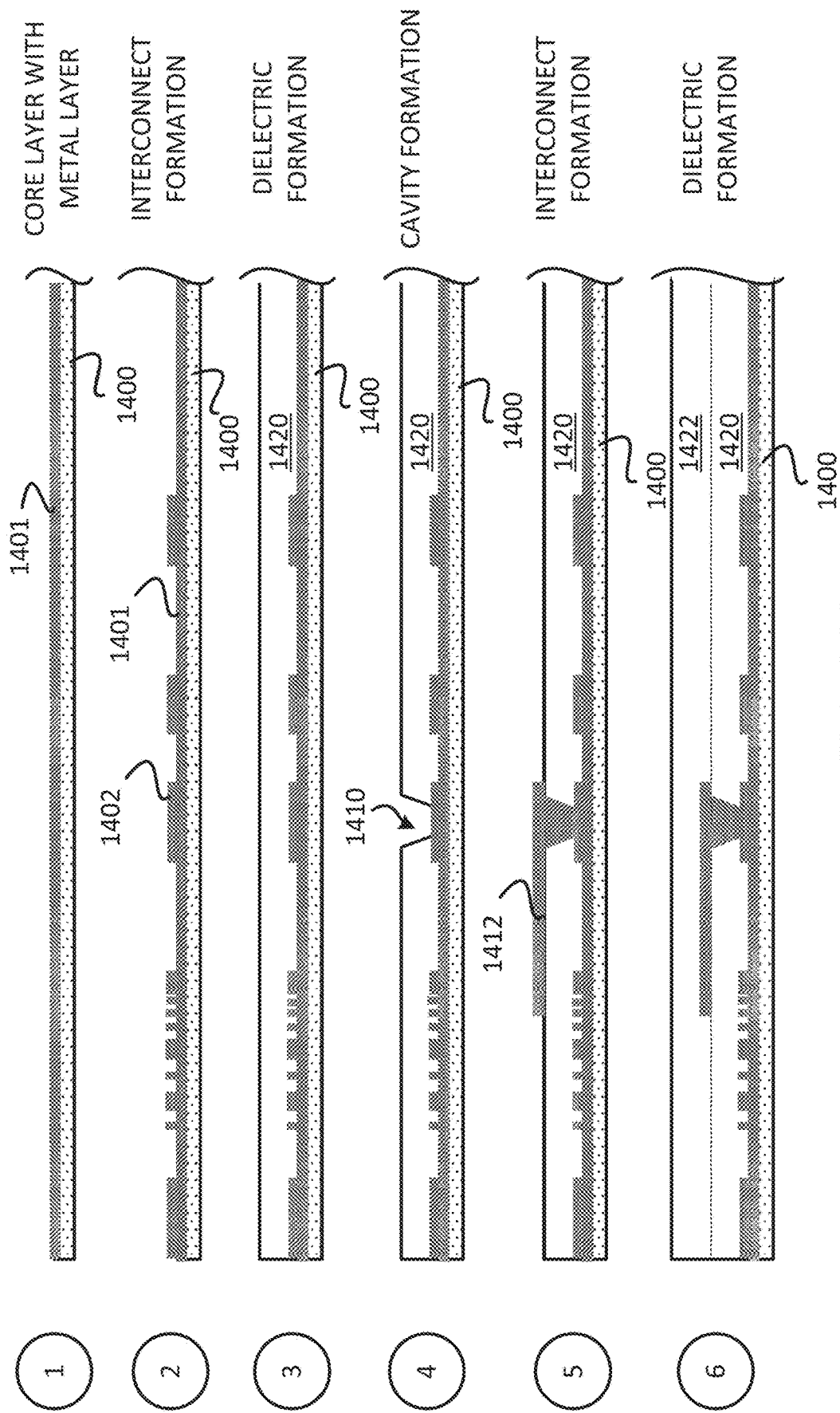
FIGS. 14A-14C illustrate an exemplary sequence for fabricating a substrate.
Figure 14B:
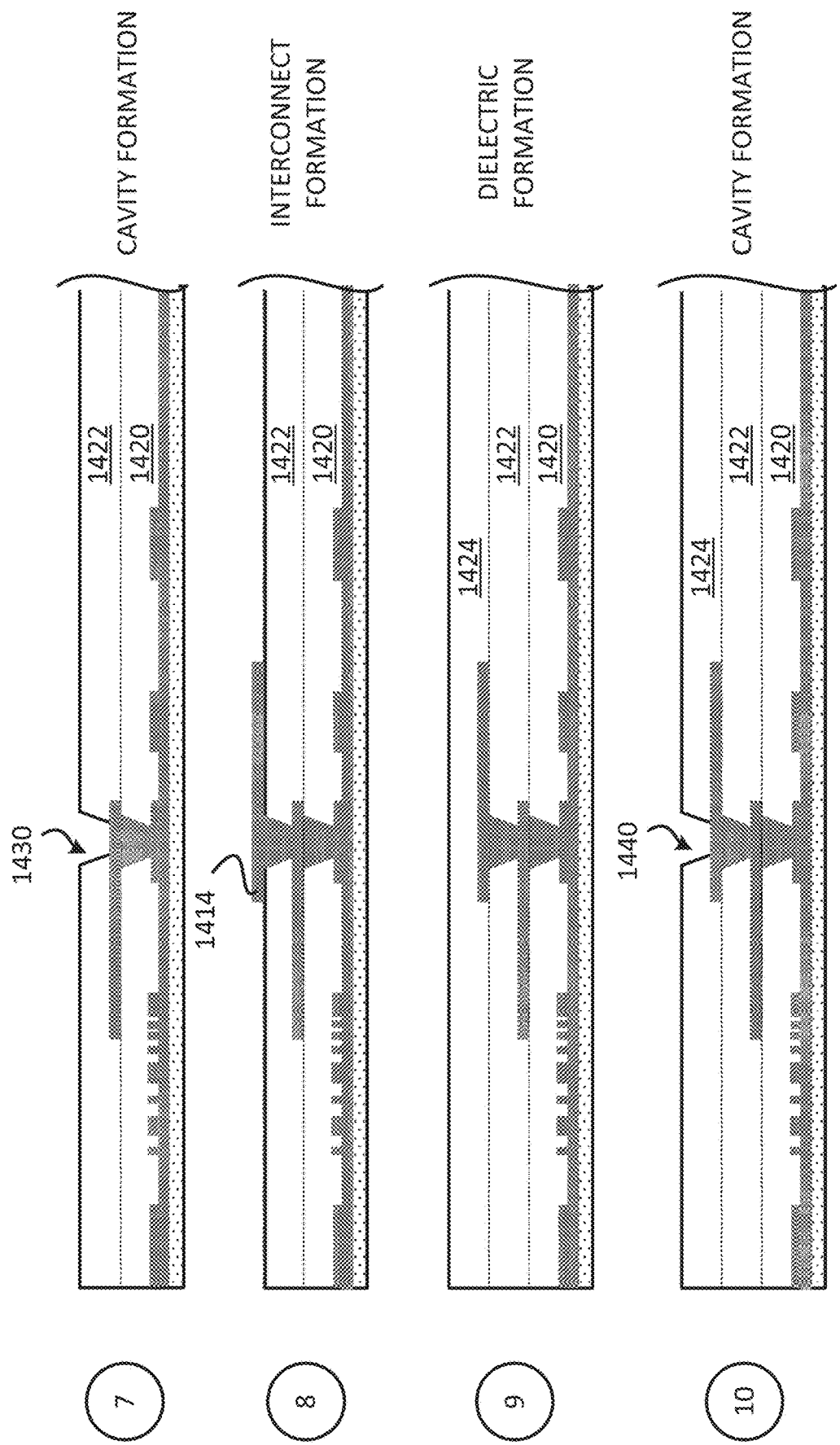
Figure 14C:
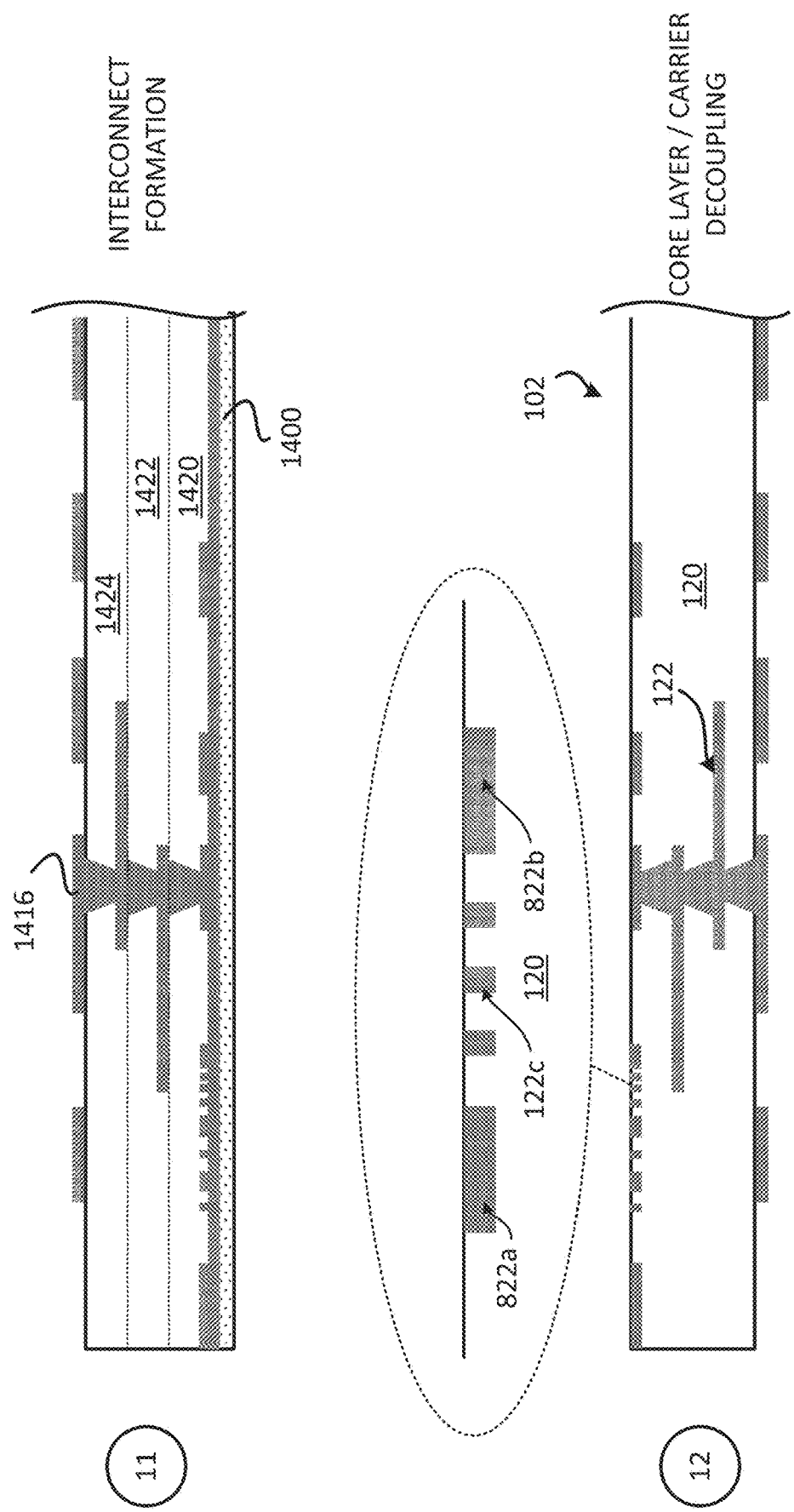

Stage 1, as shown in FIG. 8, illustrates a state after a substrate 102 is provided. The substrate 102 may be fabricated. FIGS. 14A-14C below, illustrate and describe an example of fabricating a substrate 102 that includes a plurality of interconnects (e.g., 122). The substrate 102 may include an embedded trace substrate (ETS).

Stage 2 illustrates a state after interconnects are formed over some of the interconnects of the substrate 102. For example, the interconnect 823a may be formed over the interconnect 822a, and the interconnect 823b may be formed over the interconnect 822b. The interconnect 823a and/or the interconnect 823b may be pillar interconnects. A plating process may be used to form the interconnect 823a and/or the interconnect 823b.

Stage 3 illustrates a state after a solder resist layer 140 is formed over the at least one dielectric layer 120 and the interconnect 823a and/or the interconnect 823b. A lamination and/or coating process may be used to form the solder resist layer 140.

Stage 4 illustrates a state after the solder resist layer 140 is thinned such that the solder resist layer 140 has a thickness that is less than the thickness of the interconnect 823a and/or the interconnect 823b. An etching process may be used to thin the solder resist layer 140.

Stage 5 illustrates a state after the interconnect 823a and/or the interconnect 823b is thinned such that the interconnect 823a and/or the interconnect 823b has a thickness than is less than the thickness of the solder resist layer 140. An opening 802 in the solder resist layer 140 may be formed over the interconnect 823a as a result of the thinning of the interconnect 823a. An opening 804 in the solder resist layer 140 may be formed over the interconnect 823b as a result of the thinning of the interconnect 823b. The size and/or shape of the opening(s) (e.g., 802, 804) may be about equal and/or the same as the size and/or shape of the interconnect(s) over which the opening(s) is formed. An etching process may be used to thin the interconnect 823a and/or the interconnect 823b. The interconnect 822a and the interconnect 823a may form the protruding pad interconnect 122a. The interconnect 822a may represent a first portion (e.g., 222a) of the protruding pad interconnect 122a. The interconnect 823a may represent a second portion (e.g., 223a) of the protruding pad interconnect 122a. The interconnect 822b and the interconnect 823b may form the protruding pad interconnect 122b. The interconnect 822b may represent a first portion (e.g., 222b) of the protruding pad interconnect 122b. The interconnect 823b may represent a second portion (e.g., 223b) of the protruding pad interconnect 122b.

Figure 9:
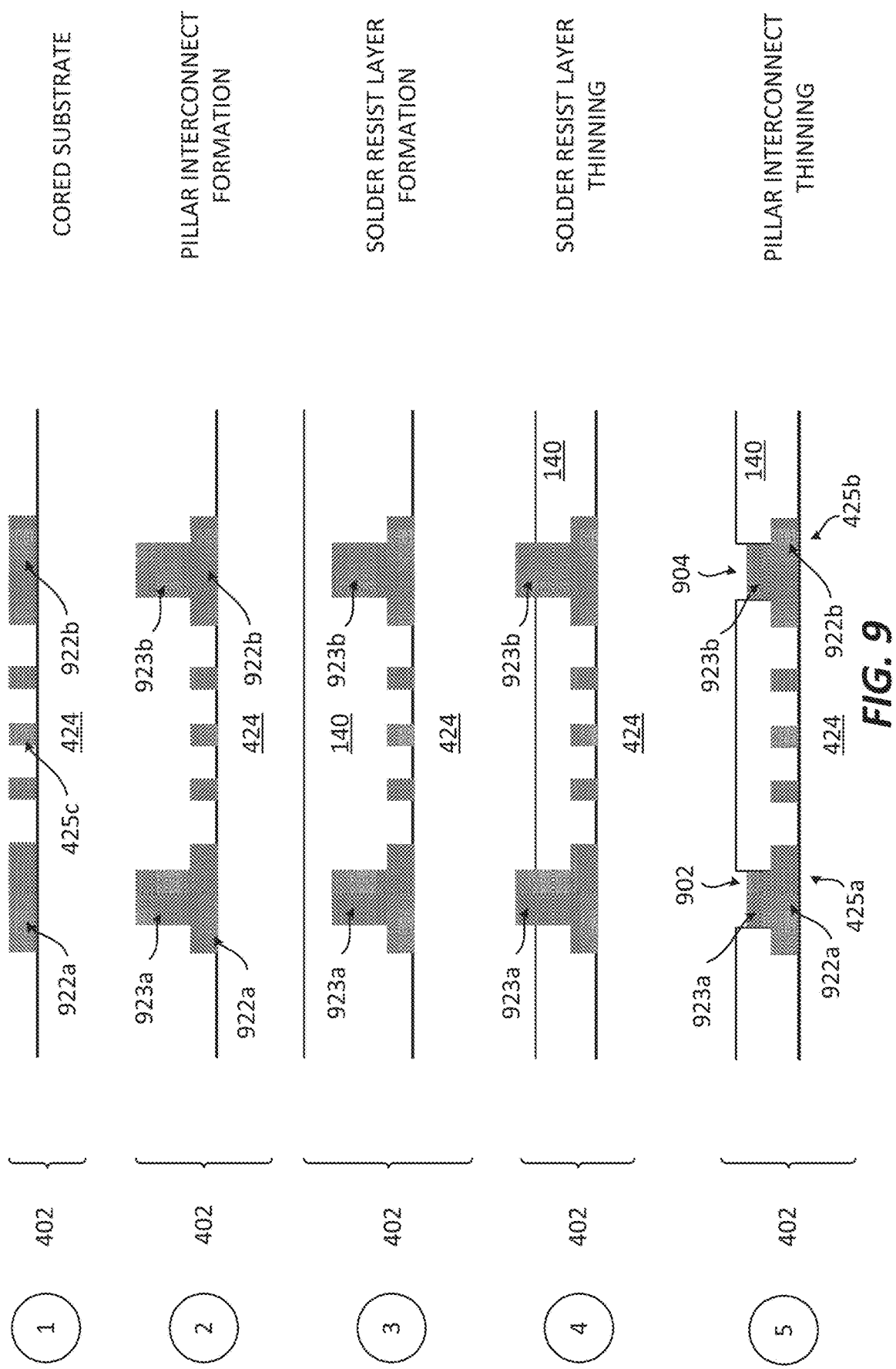
FIG. 9 illustrates an exemplary sequence for fabricating a cored substrate with protruding pad interconnects.

FIG. 9 illustrates another exemplary sequence for providing or fabricating a substrate that includes protruding pad interconnects. In some implementations, the sequence of FIG. 9 may be used to provide or fabricate the substrate 402 of FIGS. 4-5. However, the process of FIG. 9 may be used to fabricate other substrates described in the disclosure. The sequence of FIG. 9 may be used in conjunction with the sequence of FIGS. 12A-12D.

It should be noted that the sequence of FIG. 9 may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 9, illustrates a state after a substrate 402 is provided. The substrate 402 may be fabricated. FIGS. 12A-12D below, illustrate and describe an example of fabricating a substrate 402 that includes a plurality of interconnects. The substrate 402 may include a cored substrate.

Stage 2 illustrates a state after interconnects are formed over some of the interconnects of the substrate 402. For example, the interconnect 923a may be formed over the interconnect 922a, and the interconnect 923b may be formed over the interconnect 922b. The interconnect 923a and/or the interconnect 923b may be pillar interconnects. A plating process may be used to form the interconnect 923a and/or the interconnect 923b.

Stage 3 illustrates a state after a solder resist layer 140 is formed over the at least one dielectric layer 424 and the interconnect 922a, the interconnect 922b, the interconnect 923a and/or the interconnect 923b. A lamination and/or coating process may be used to form the solder resist layer 140.

Stage 4 illustrates a state after the solder resist layer 140 is thinned such that the solder resist layer 140 has a thickness that is less than the thickness of the interconnect 922a, the interconnect 922b, the interconnect 923a and/or the interconnect 923b. An etching process may be used to thin the solder resist layer 140.

Stage 5 illustrates a state after the interconnect 923a and/or the interconnect 923b is thinned such that the interconnect 923a and/or the interconnect 923b has a thickness than is less than the thickness of the solder resist layer 140. An opening 902 in the solder resist layer 140 may be formed over the interconnect 923a as a result of the thinning of the interconnect 923a. An opening 904 in the solder resist layer 140 may be formed over the interconnect 923b as a result of the thinning of the interconnect 923b. The size and/or shape of the opening(s) (e.g., 902, 904) may be about equal and/or the same as the size and/or shape of the interconnect(s) over which the opening(s) is formed. An etching process may be used to thin the interconnect 923a and/or the interconnect 923b. The interconnect 922a and the interconnect 923a may form the protruding pad interconnect 425a. The interconnect 922a may represent a first portion (e.g., 522a) of the protruding pad interconnect 425a. The interconnect 923a may represent a second portion (e.g., 523a) of the protruding pad interconnect 425a. The interconnect 922b and the interconnect 923b may form the protruding pad interconnect 425b. The interconnect 922b may represent a first portion (e.g., 522b) of the protruding pad interconnect 425b. The interconnect 923b may represent a second portion (e.g., 523b) of the protruding pad interconnect 425b.

Figure 10:
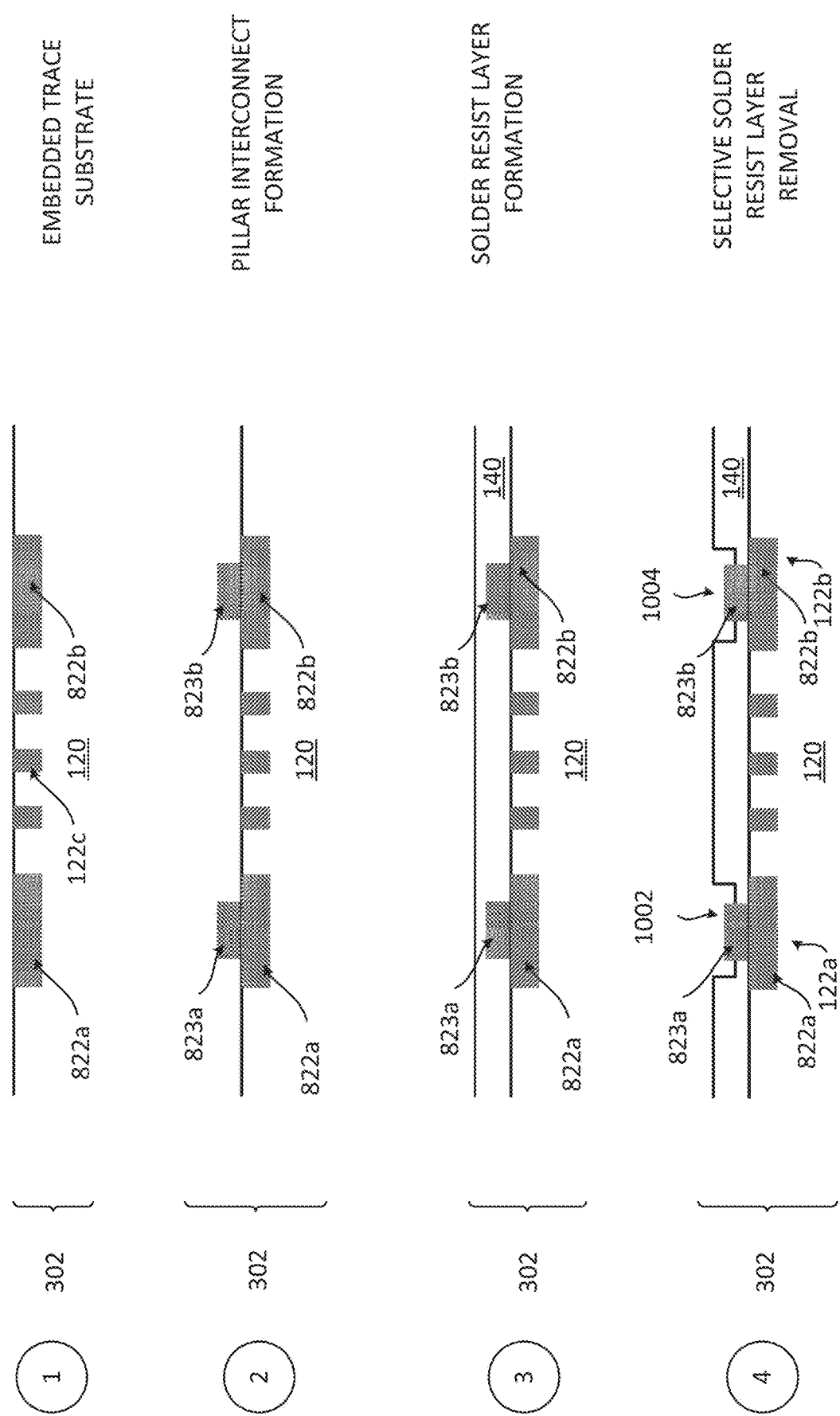
FIG. 10 illustrates an exemplary sequence for fabricating an embedded trace substrate with protruding pad interconnects.
Figure 11:
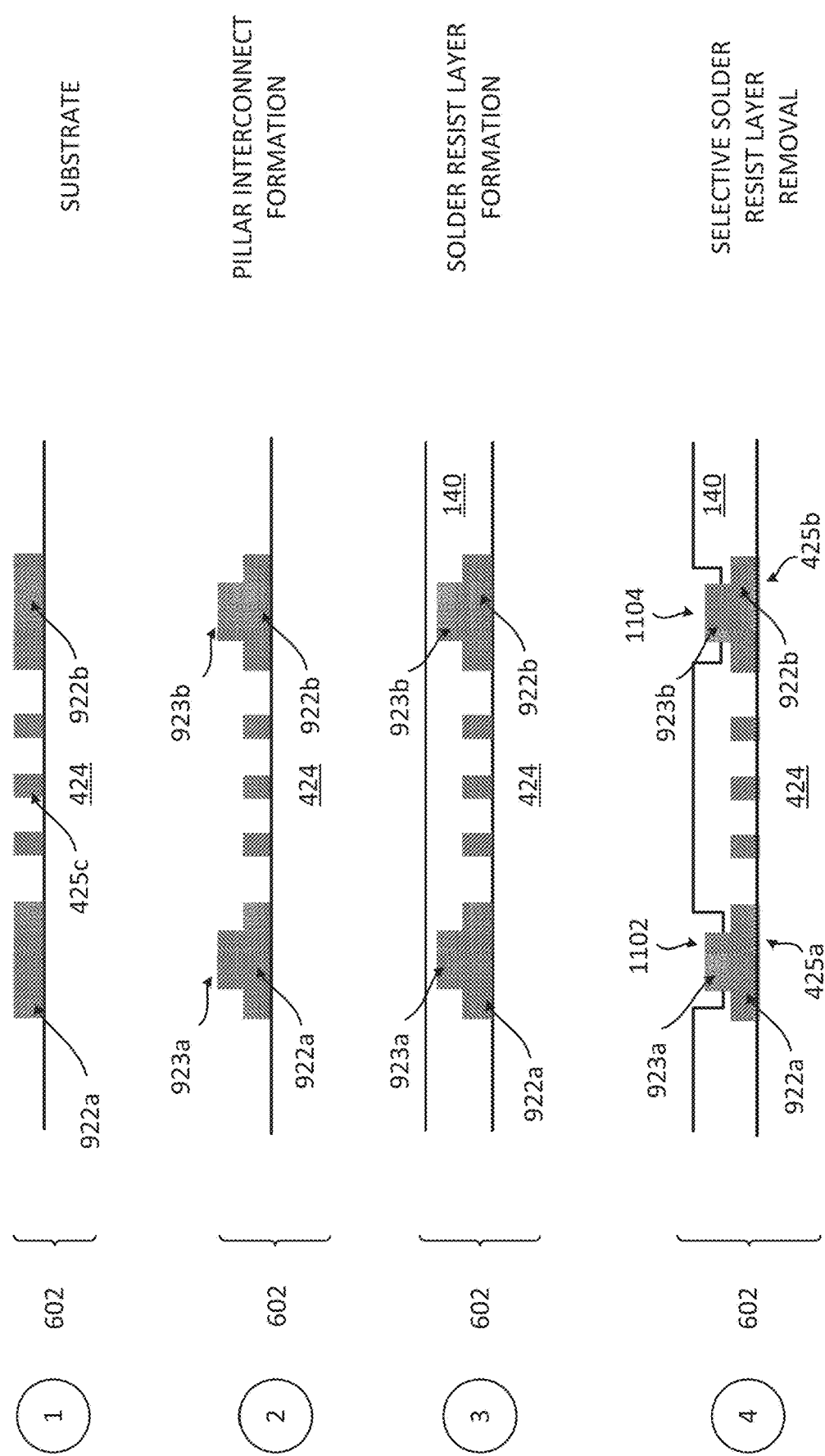
FIG. 11 illustrates an exemplary sequence for fabricating a cored substrate with protruding pad interconnects.

Exemplary Sequences for Fabricating a Substrate Comprising Protruding Pad Interconnects As mentioned above, in some implementations, the size of the opening in the solder resist layer over an interconnect may be different. FIGS. 10 and 11 illustrate examples of fabricating a substrate with protruding pad interconnects, where the size of the openings in the solder resist layer over an interconnect may be different.

FIG. 10 illustrates an exemplary sequence for providing or fabricating a substrate that includes protruding pad interconnects. In some implementations, the sequence of FIG. 10 may be used to provide or fabricate the substrate 302 of FIG. 3. However, the process of FIG. 10 may be used to fabricate other substrates described in the disclosure. The sequence of FIG. 10 may be used in conjunction with the sequence of FIGS. 14A-14C.

It should be noted that the sequence of FIG. 10 may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10, illustrates a state after a substrate 302 is provided. The substrate 302 may be fabricated. FIGS. 14A-14C below, illustrates and describes an example of fabricating a substrate 102 that includes a plurality of interconnects (e.g., 122). The substrate 302 may be similar to the substrate 102. The substrate 302 may include an embedded trace substrate.

Stage 2 illustrates a state after interconnects are formed over some of the interconnects of the substrate 302. For example, the interconnect 823a may be formed over the interconnect 822a, and the interconnect 823b may be formed over the interconnect 822b. The interconnect 823a and/or the interconnect 823b may be pillar interconnects. A plating process may be used to form the interconnect 823a and/or the interconnect 823b.

Stage 3 illustrates a state after a solder resist layer 140 is formed over the at least one dielectric layer 120 and the interconnect 823a and/or the interconnect 823b. A lamination, coating and/or exposure process may be used to form the solder resist layer 140. The solder resist layer 140 may have a thickness that is thicker than the thickness of the interconnects 822a and 823a.

Stage 4 illustrates a state after the solder resist layer 140 is selectively thinned such that portions of the solder resist layer 140 has a thickness that is less than the thickness of the interconnect 823a and/or the interconnect 823b. A selective etching process may be used to selectively thin the solder resist layer 140. Selectively etching the solder resist layer 140 may form an opening 1002 and an opening 1004 in the solder resist layer 140. The opening 1002 in the solder resist layer 140 may be formed over the interconnect 823a. The opening 1004 in the solder resist layer 140 may be formed over the interconnect 823b. The size (e.g., width) of the opening(s) (e.g., 1002, 1004) equal and/or less than the size of the interconnect(s) over which the opening(s) is formed.

FIG. 11 illustrates another exemplary sequence for providing or fabricating a substrate that includes protruding pad interconnects. In some implementations, the sequence of FIG. 11 may be used to provide or fabricate the substrate 602 of FIG. 6. However, the process of FIG. 11 may be used to fabricate other substrates described in the disclosure. The sequence of FIG. 11 may be used in conjunction with the sequence of FIGS. 12A-12D.

It should be noted that the sequence of FIG. 11 may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11, illustrates a state after a substrate 602 is provided. The substrate 602 may be fabricated. FIGS. 12A-12D below, illustrates and describes an example of fabricating a substrate 402 that includes a plurality of interconnects. The substrate 602 is similar to the substrate 402. The substrate 602 may include a cored substrate.

Stage 2 illustrates a state after interconnects are formed over some of the interconnects of the substrate 402. For example, the interconnect 923a may be formed over the interconnect 922a, and the interconnect 923b may be formed over the interconnect 922b. The interconnect 923a and/or the interconnect 923b may be pillar interconnects. A plating process may be used to form the interconnect 923a and/or the interconnect 923b.

Stage 3 illustrates a state after a solder resist layer 140 is formed over the at least one dielectric layer 424 and the interconnect 922a, the interconnect 922b, the interconnect 923a and/or the interconnect 923b. A lamination, coating and/or exposure process may be used to form the solder resist layer 140. The solder resist layer 140 may have a thickness that is thicker than the thickness of the interconnects 922a and 923a.

Stage 4 illustrates a state after the solder resist layer 140 is selectively thinned such that portions of the solder resist layer 140 has a thickness that is less than the thickness of the interconnect 922a, the interconnect 922b, the interconnect 923a and/or the interconnect 923b. A selective etching process may be used to selectively thin the solder resist layer 140. Selectively etching the solder resist layer 140 may form an opening 1102 and an opening 1104 in the solder resist layer 140. The opening 1102 in the solder resist layer 140 may be formed over the interconnect 922a and the interconnect 923a. The opening 1104 in the solder resist layer 140 may be formed over the interconnect 922b and the interconnect 923b. The size (e.g., width) of the opening(s) (e.g., 1102, 1104) is greater than the size (e.g., width) of the interconnect 923a and/or the interconnect 923b. However, the size (e.g., width) of the opening(s) (e.g., 1102, 1104) may be equal or less than the size (e.g., width) of the interconnect 922a and/or the interconnect 922b.

Exemplary Sequence for Fabricating a Substrate Comprising Protruding Pad Interconnects FIGS. 12A-12D illustrate an exemplary sequence for providing or fabricating a substrate. In some implementations, the sequence of FIGS. 12A-12D may be used to provide or fabricate the substrate 402 of FIG. 4, or other substrates (e.g., 602) described in the disclosure. FIGS. 12A-12D may be used in conjunction with the sequences of FIG. 9 or FIG. 11 to fabricate a substrate that includes protruding pad interconnects.

It should be noted that the sequence of FIGS. 12A-12D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 12A:
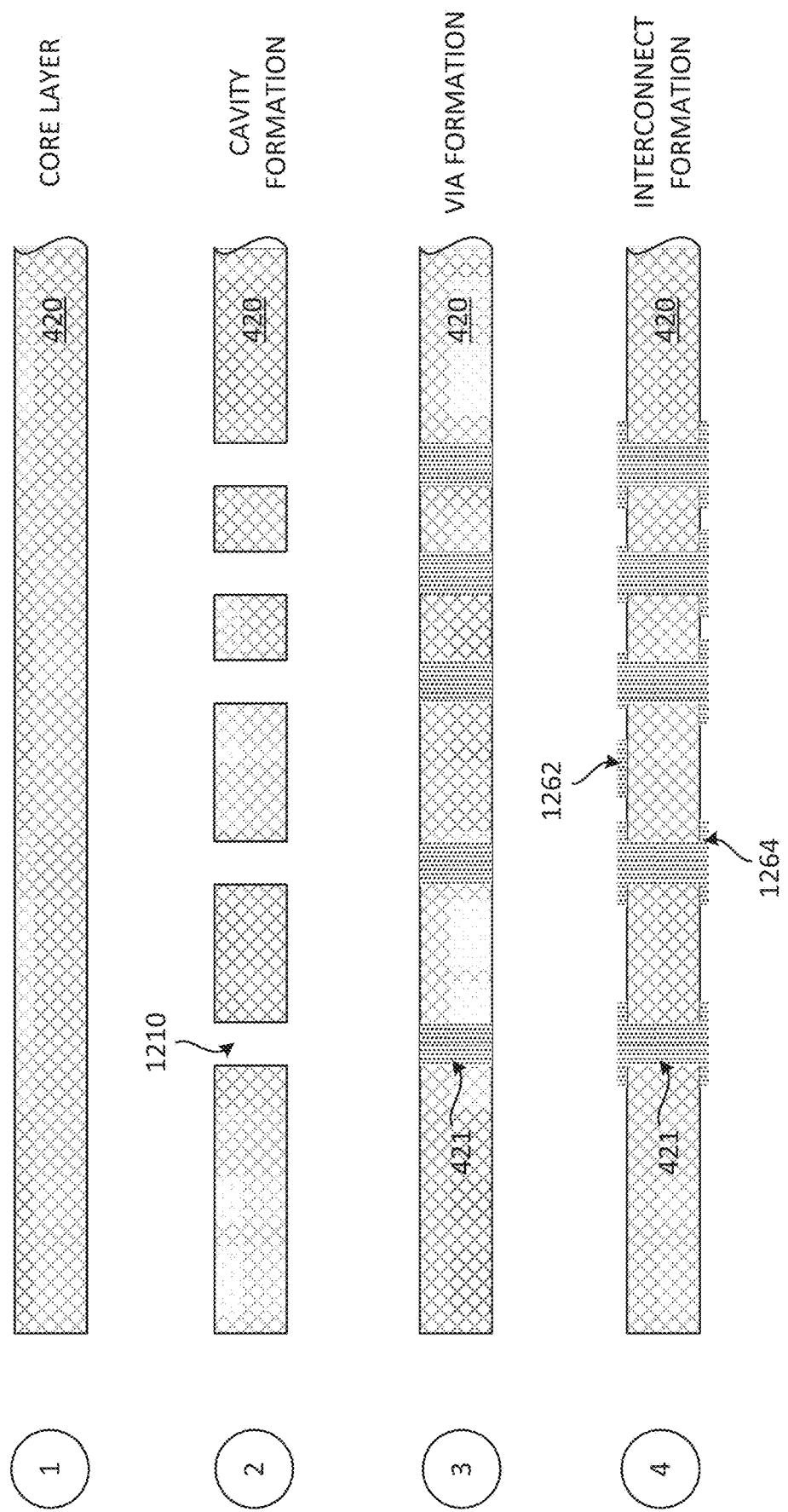
FIGS. 12A-12D illustrate an exemplary sequence for fabricating a substrate.

Stage 1, as shown in FIG. 12A, illustrates a state after a core layer 420 is provided. The core layer 420 may include glass or glass fiber with resin. However, the core layer 420 may include different materials. The core layer 420 may have different thicknesses.

Stage 2 illustrates a state after a plurality of cavities 1210 is formed in the core layer 420. The plurality of cavities 1210 may be formed through a laser process and/or a drilling process. The plurality of cavities 1210 may travel through the core layer 420.

Stage 3 illustrates a state after a plurality of core interconnects are formed in the plurality of cavities 1210. For example, a first plurality of core interconnects 421 may be formed in the plurality of cavities 1210. A plating process may be used to form the first plurality of core interconnects 421. However, different implementations may use different processes for forming the first plurality of core interconnects 421. The first plurality of core interconnects 421 may include core vias located in the core layer 420.

Stage 4 illustrates a state after a plurality of interconnects 1262 is formed over the first surface (e.g., top surface) of the core layer 420. The plurality of interconnects 1262 may be coupled to the first plurality of core interconnects 421. Stage 4 also illustrates a state after a plurality of interconnects 1264 is formed over the second surface (e.g., bottom surface) of the core layer 420. The plurality of interconnects 1264 may be coupled to the first plurality of core interconnects 421. A patterning process, a stripping process and/or a plating process may be used to form the plurality of interconnects 1262 and the plurality of interconnects 1264.

Figure 12B:
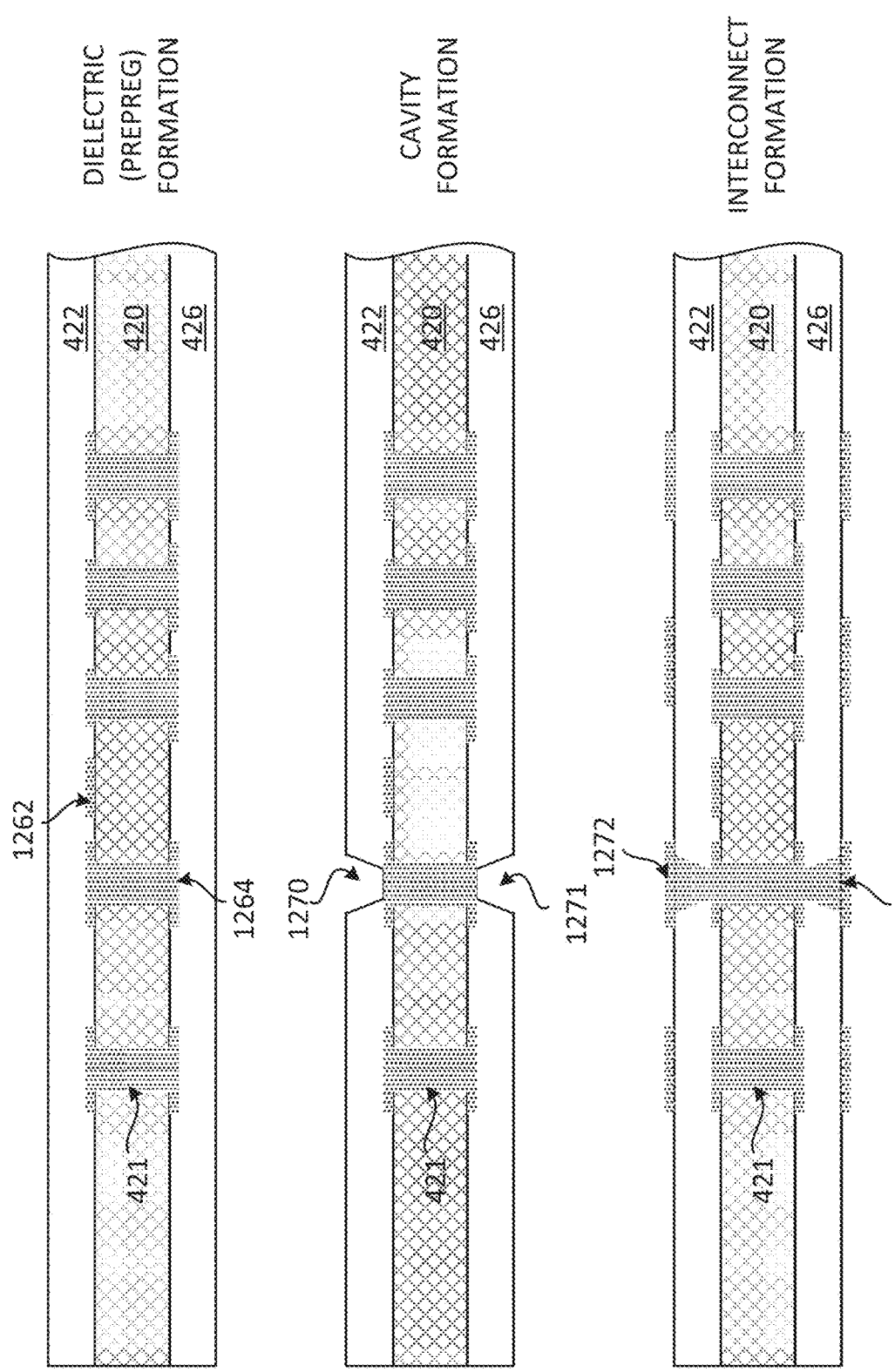

Stage 5, as shown in FIG. 12B, illustrates a state after a dielectric layer 422 is formed over the first surface of the core layer 420, and a dielectric layer 426 is formed over the second surface of the core layer 420. A deposition process and/or lamination process may be used to form dielectric layers 422 and 426. The dielectric layers 422 and 426 may include prepreg (e.g., prepreg layers).

Stage 6 illustrates a state after a plurality of cavities 1270 is formed in the dielectric layer 422, and a plurality of cavities 1271 is formed in the dielectric layer 426. A laser process (e.g., laser drilling, laser ablation) may be used to form the plurality of cavities 1270 and the plurality of cavities 1271.

Stage 7 illustrates a state after a plurality of interconnects 1272 is formed over and coupled to the dielectric layer 422 and the plurality of cavities 1270. The plurality of interconnects 1272 may be coupled to the plurality of interconnects 1262. Stage 7 also illustrates a state after a plurality of interconnects 1274 is formed over and coupled the dielectric layer 426 and the plurality of cavities 1271. The plurality of interconnects 1274 may be coupled to the plurality of interconnects 1264. A patterning process, a stripping process and/or a plating process may be used to form the plurality of interconnects 1272 and the plurality of interconnects 1274.

Figure 12C:
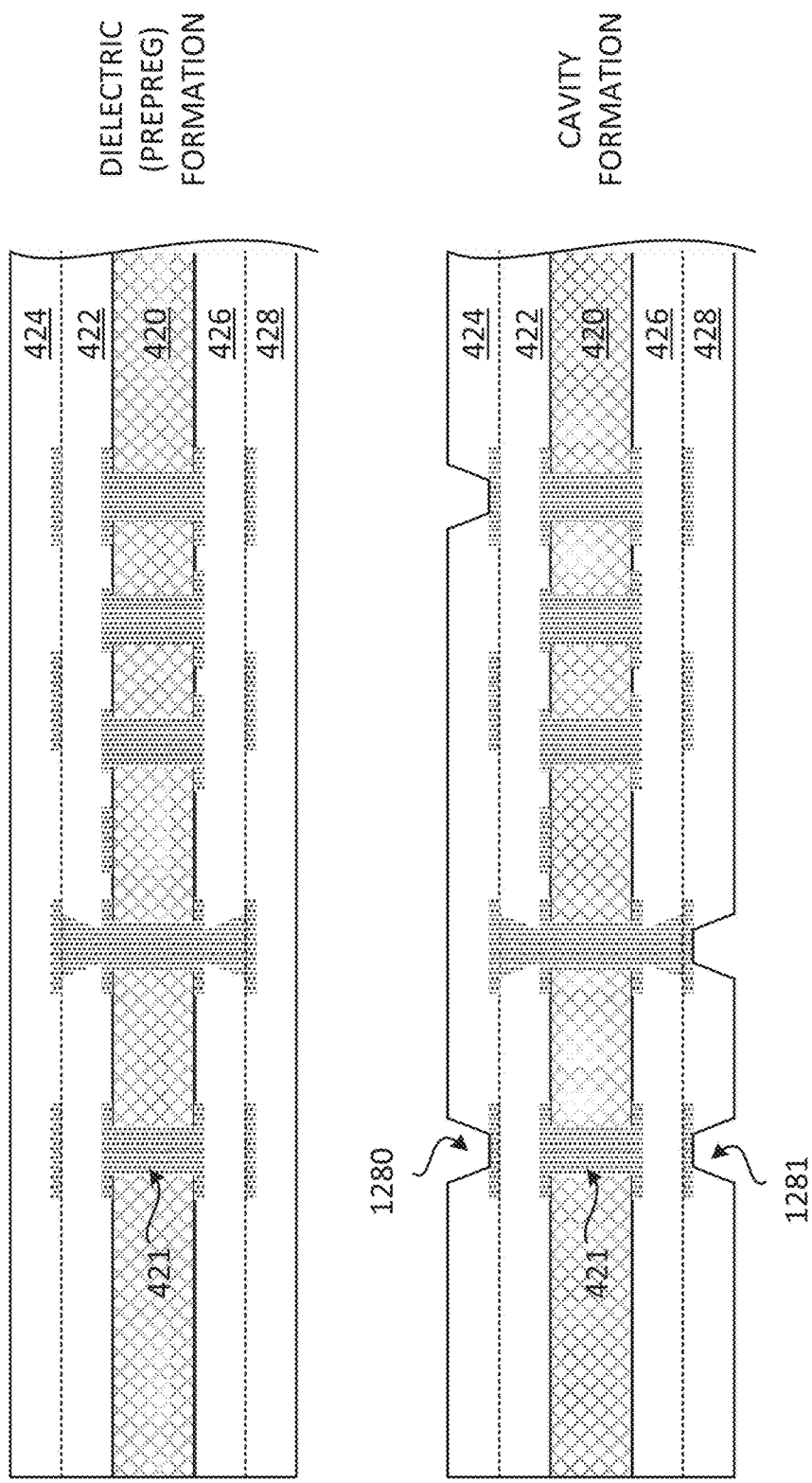

Stage 8, as shown in FIG. 12C, illustrates a state after a dielectric layer 424 is formed over and coupled to a first surface of dielectric layer 422, and a dielectric layer 428 is formed over and coupled to a second surface of the dielectric layer 426. A deposition process and/or lamination process may be used to form dielectric layers 424 and 428. The dielectric layers 424 and 428 may include prepreg (e.g., prepreg layers).

Stage 9 illustrates a state after a plurality of cavities 1280 is formed in the dielectric layer 424, and a plurality of cavities 1281 is formed in the dielectric layer 428. A laser process (e.g., laser drilling, laser ablation) may be used to form the plurality of cavities 1280 and the plurality of cavities 1281.

Figure 12D:
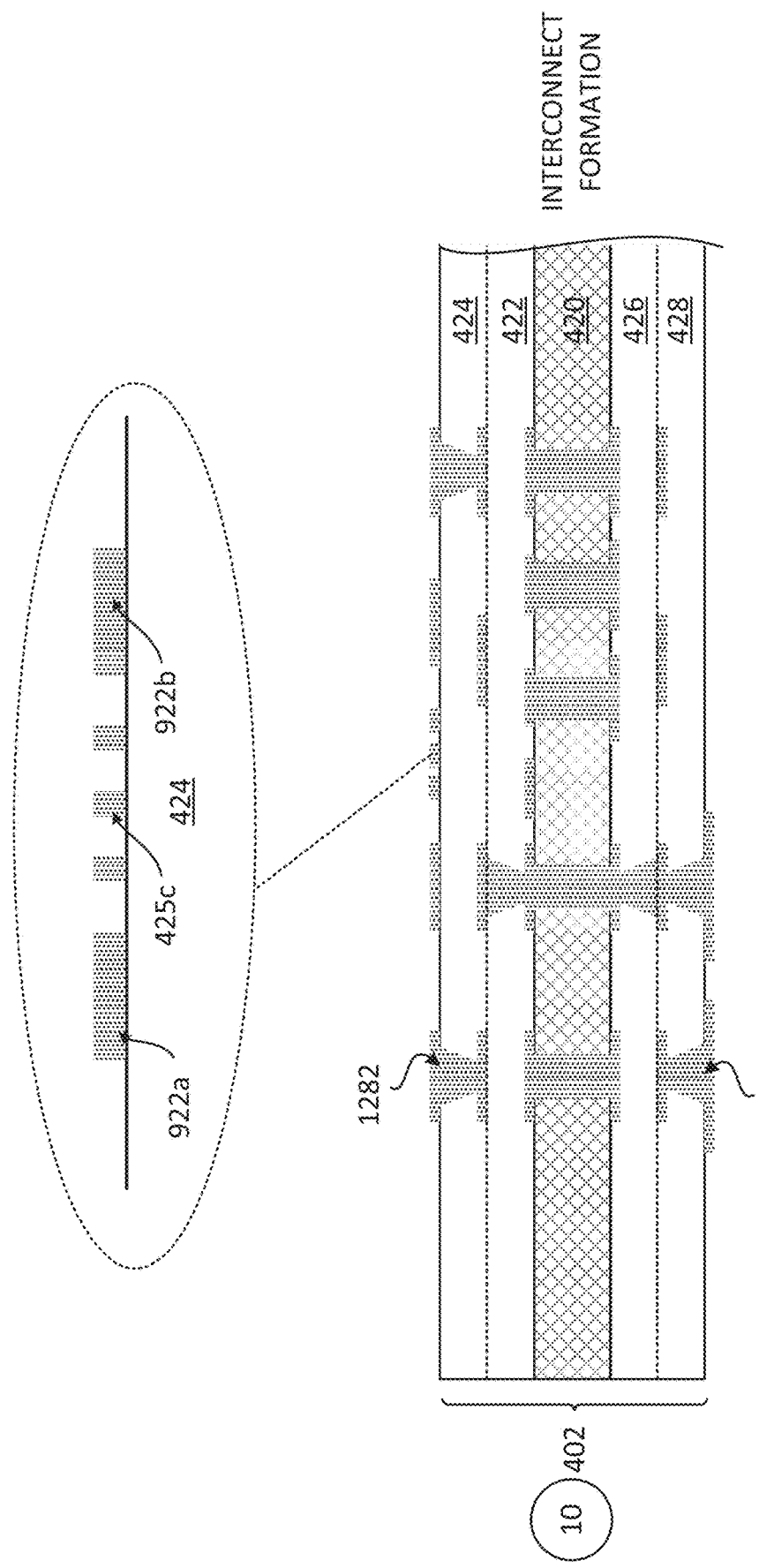

Stage 10, as shown in FIG. 12D, illustrates a state after a plurality of interconnects 1282 is formed over and coupled to the dielectric layer 424 and the plurality of cavities 1280. The plurality of interconnects 1282 may be coupled to the plurality of interconnects 1272. Stage 10 also illustrates a state after a plurality of interconnects 1284 is formed over and coupled to the dielectric layer 428 and the plurality of cavities 1281. The plurality of interconnects 1284 may be coupled to the plurality of interconnects 1274. A patterning process, a stripping process and/or a plating process may be used to form the plurality of interconnects 1282 and the plurality of interconnects 1284. It is noted that additional dielectric layers and additional interconnects may be formed by repeating Stages 8-10 of FIGS. 12C-12D, as described above. The plurality of interconnects 1282 may represent the plurality of interconnects 425. The plurality of interconnects 1282 may include interconnect 922a, interconnect 425c and interconnect 922b. Stage 10 may illustrate an example of the substrate 402 that includes a plurality of interconnects. Once the substrate 402 is fabricated, additional processes may be performed to form a substrate with protruding pad interconnects. Examples how protruding pad interconnects may be fabricated in a substrate are described in FIGS. 9 and 11.

Figure 13:
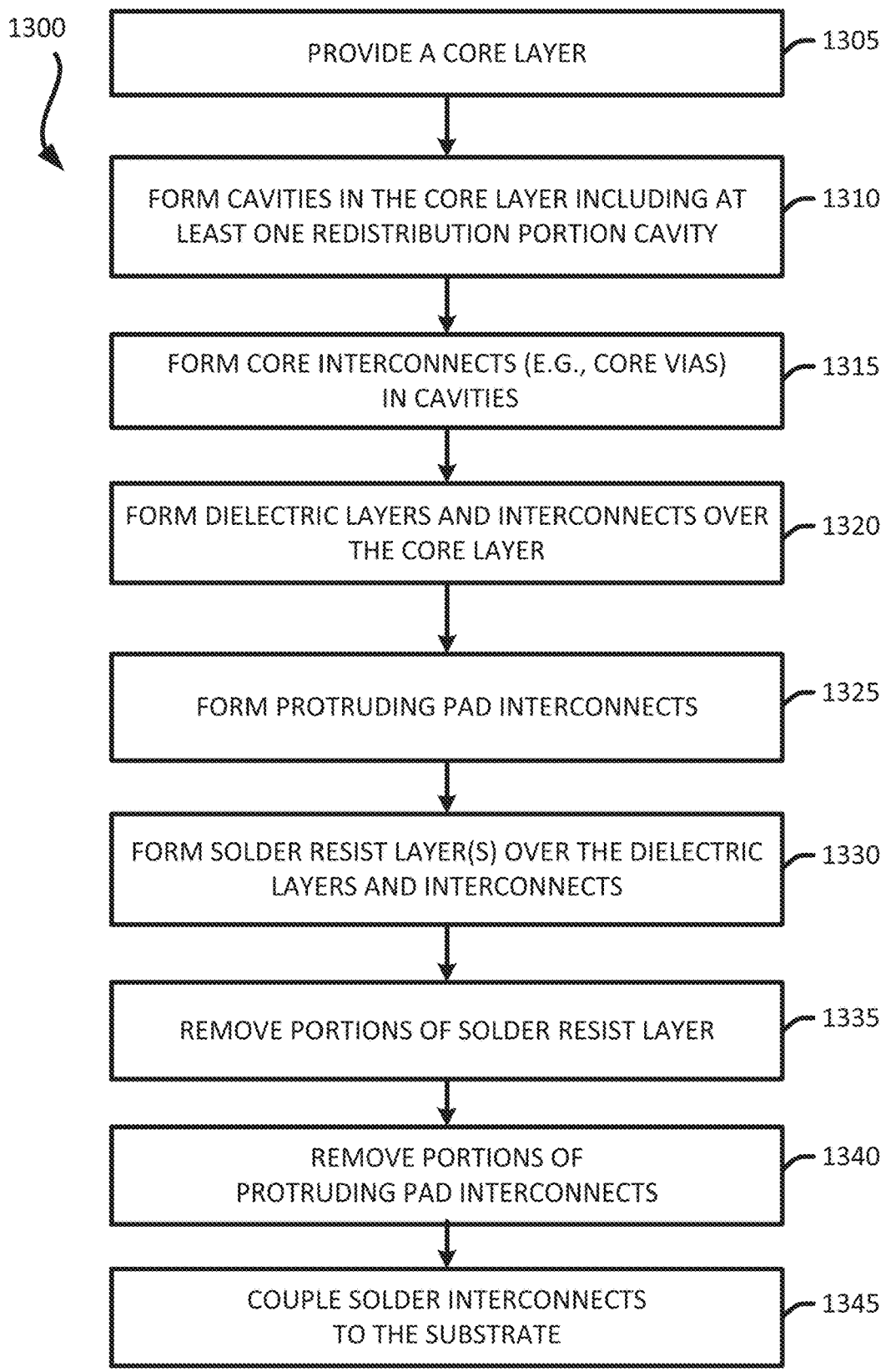
FIG. 13 illustrates an exemplary flow diagram of a method for fabricating a substrate.

Exemplary Flow Diagram of a Method for Fabricating a Substrate Comprising Protruding Pad Interconnects In some implementations, fabricating a substrate includes several processes. FIG. 13 illustrates an exemplary flow diagram of a method 1300 for providing or fabricating a substrate. In some implementations, the method 1300 of FIG. 13 may be used to provide or fabricate the substrate of FIG. 4. For example, the method of FIG. 13 may be used to fabricate the substrate 402. However, the method of FIG. 13 may be used fabricate any substrate in the disclosure, such as for example, the substrates of FIG. 6.

It should be noted that the method of FIG. 13 may combine one or more processes in order to simplify and/or clarify the method for providing or fabricating a substrate. In some implementations, the order of the processes may be changed or modified.

The method provides (at 1305) a core layer (e.g., 420). The core layer 420 may include glass or glass fiber with resin. However, the core layer 420 may include different materials. The core layer 420 may have different thicknesses. Stage 1 of FIG. 12A illustrates and describes an example of a core layer that is provided.

The method forms (at 1310) a plurality of cavities (e.g., 1210) in the core layer. A laser process or a drilling process may be used to form the cavities. The plurality of cavities may travel through the core layer 420. Stage 2 of FIG. 12A illustrates and describes examples of forming cavities in the core layer.

The method form (at 1315) a plurality of core interconnects (e.g., 421) in the plurality of cavities (e.g., 1210). For example, a first plurality of core interconnects 421 may be formed in the plurality of cavities 1210. A plating process may be used to form the first plurality of core interconnects 421. However, different implementations may use different processes for forming the first plurality of core interconnects 421. The first plurality of core interconnects 421 may include core vias located in the core layer 420. Stage 3 of FIG. 12A illustrates and describes an example of core interconnects located in the core layer.

The method forms (at 1320) a plurality of interconnects (e.g., 425, 427) and at least one dielectric layer (e.g., 422, 424) over a first surface of the core layer and a second surface of the core layer (e.g., 420). A patterning process, a stripping process and/or a plating process may be used to form the plurality of interconnects. A laser process (e.g., laser drilling, laser ablation) may be used to form the plurality of cavities in a dielectric layer. A deposition process and/or a lamination process may be used to form at least one dielectric layer. The at least one dielectric layer may include prepreg (e.g., prepreg layer). Stages 5-10 of FIGS. 12B-12D illustrate and describe examples of forming a plurality of interconnects and at least one dielectric layer (e.g., prepreg).

The method forms (at 1325) a plurality of protruding pad interconnects (e.g., 425a, 425b) by forming a plurality of interconnect (e.g., 923a, 923b) over some pads from the plurality of interconnects 1282. The plurality of pads (e.g., 923a, 923b) may be used to form protruding pad interconnects (e.g., 425a, 425b). A plating process may be used to form the plurality of pads (e.g., 923a, 923b). Stage 2 of FIG. 9 illustrates and describes an example of forming protruding pad interconnects.

The method forms (at 1330) at least one solder resist layer (e.g., 140) over a first surface of a dielectric layer, and at least one solder resist layer (e.g., 142) over a second surface of a dielectric layer. The solder resist layer 140 may be formed over a plurality of protruding pad interconnects. A lamination, coating and/or exposure process may be used to form the solder resist layer 140 and the solder resist layer 140. Stage 3 of FIG. 9 illustrates and describes an example of forming solder resist layers over dielectric layers.

The method removes (at 1335) portions of the solder resist layer (e.g., 140). Removing portions of the solder resist layer may include thinning portions of the solder resist layer. In some implementations, some portions of the solder resist layer 140 may have a lower thickness than the thickness of the plurality of protruding pad interconnects 425a. A sand blasting process may be used to remove portions of the solder resist layer 140. Stage 4 of FIG. 9 illustrates and describes an example of removing portions of a solder resist layer. Stage 4 of FIG. 11 illustrates and describes an example of removing portions of a solder resist layer.

The method may remove (at 1340) portions of the protruding pad interconnects to thin the protruding pad interconnects such that the protruding pad interconnects has an overall thickness that is less than the maximum thickness of the solder resist layer (e.g., 140). Stage 5 of FIG. 9 illustrates and describes an example of removing portions of protruding pad interconnects. Stage 5 of FIG. 9 may illustrate an example of the substrate 402.

The method may couple (at 1345) a plurality of solder interconnects (e.g., 150) to the substrate (e.g., 402, 602). For example, a reflow solder process may be used to couple the plurality of solder interconnects 150 to the plurality of interconnects 427 of the substrate 402.

Exemplary Sequence for Fabricating a Substrate Comprising Protruding Pad Interconnects In some implementations, fabricating a substrate includes several processes. FIGS. 14A-14C illustrate an exemplary sequence for providing or fabricating a substrate. In some implementations, the sequence of FIGS. 14A-14C may be used to provide or fabricate the substrate 102 of FIG. 2. However, the process of FIGS. 14A-14C may be used to fabricate any of the substrates (e.g., 302) described in the disclosure. FIGS. 14A-14C may be used in conjunction with the sequences of FIG. 8 or FIG. 10 to fabricate a substrate that includes protruding pad interconnects.

It should be noted that the sequence of FIGS. 14A-14C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 14A, illustrates a state after a core layer 1400 is provided. The core layer 1400 includes a metal layer 1401. The metal layer 1401 may include a seed layer (e.g., copper seed layer). Another metal layer may be located on the other side of the core layer. It is noted that the following process will be described through a fabrication process that forms interconnects and dielectric layers on one side of the core layer. However, in some implementations, the interconnects and dielectric layers may be formed on both sides of the core layer 1400. The core layer 1400 is an example of a carrier that is used as a base. In some implementations, other carriers may be used, such as glass or quartz.

Stage 2 illustrates a state after interconnects 1402 are formed over the core layer 1400 and the metal layer 1401. The interconnects 1402 may be patterned from a metal layer. A plating process and etching process may be used to form the metal layer and interconnects.

Stage 3 illustrates a state after a dielectric layer 1420 is formed over the core layer 1400 and the interconnects 1402. The dielectric layer 1420 may include polyimide. A deposition and/or lamination process may be used to form the dielectric layer 1420. However, different implementations may use different materials for the dielectric layer.

Stage 4 illustrates a state after a plurality of cavities 1410 is formed in the dielectric layer 1420. The plurality of cavities 1410 may be formed using an etching process (e.g., photo etching process) or laser process.

Stage 5 illustrates a state after interconnects 1412 are formed in and over the dielectric layer 1420. For example, a via, pad and/or traces may be formed. A plating process may be used to form the interconnects.

Stage 6 illustrates a state after another dielectric layer 1422 is formed over the dielectric layer 1420. The dielectric layer 1422 may be the same material as the dielectric layer 1420. However, different implementations may use different materials for the dielectric layer. A deposition and/or lamination process may be used to form the dielectric layer 1422.

Stage 7, as shown in FIG. 14B, illustrates a state after a plurality of cavities 1430 is formed in the dielectric layer 1422. An etching process or laser process may be used to form the cavities 1430.

Stage 8 illustrates a state after interconnects 1414 are formed in and over the dielectric layer 1422. For example, via, pad and/or trace may be formed. A plating process may be used to form the interconnects.

Stage 9 illustrates a state after another dielectric layer 1424 is formed over the dielectric layer 1422. The dielectric layer 1424 may be the same material as the dielectric layer 1420. However, different implementations may use different materials for the dielectric layer. A deposition and/or lamination process may be used to form the dielectric layer 1424.

Stage 10 illustrates a state after a plurality of cavities 1440 is formed in the dielectric layer 1424. An etching process or laser process may be used to form the cavities 1440.

Stage 11, as shown in FIG. 14C, illustrates a state after interconnects 1416 are formed in and over the dielectric layer 1424. For example, via, pad and/or trace may be formed. A plating process may be used to form the interconnects.

Some or all of the interconnects 1402, 1412, 1414 and/or 1416 may define the plurality of interconnects 122 of the substrate 102. The dielectric layers 1420, 1422, 1424 may be represented by the at least one dielectric layer 120.

Stage 12 illustrates a state after the core layer 1400 is decoupled (e.g., removed, grinded out) from the dielectric layer 120, leaving the substrate 102 with the plurality of interconnects 122. The substrate 102 may include interconnect 822a, interconnect 822b and interconnect 122c. Once the substrate 102 is fabricated, additional processes may be performed to form a substrate with protruding pad interconnects. Examples how protruding pad interconnects may be fabricated in a substrate are described in FIGS. 8 and 10.

Figure 15:
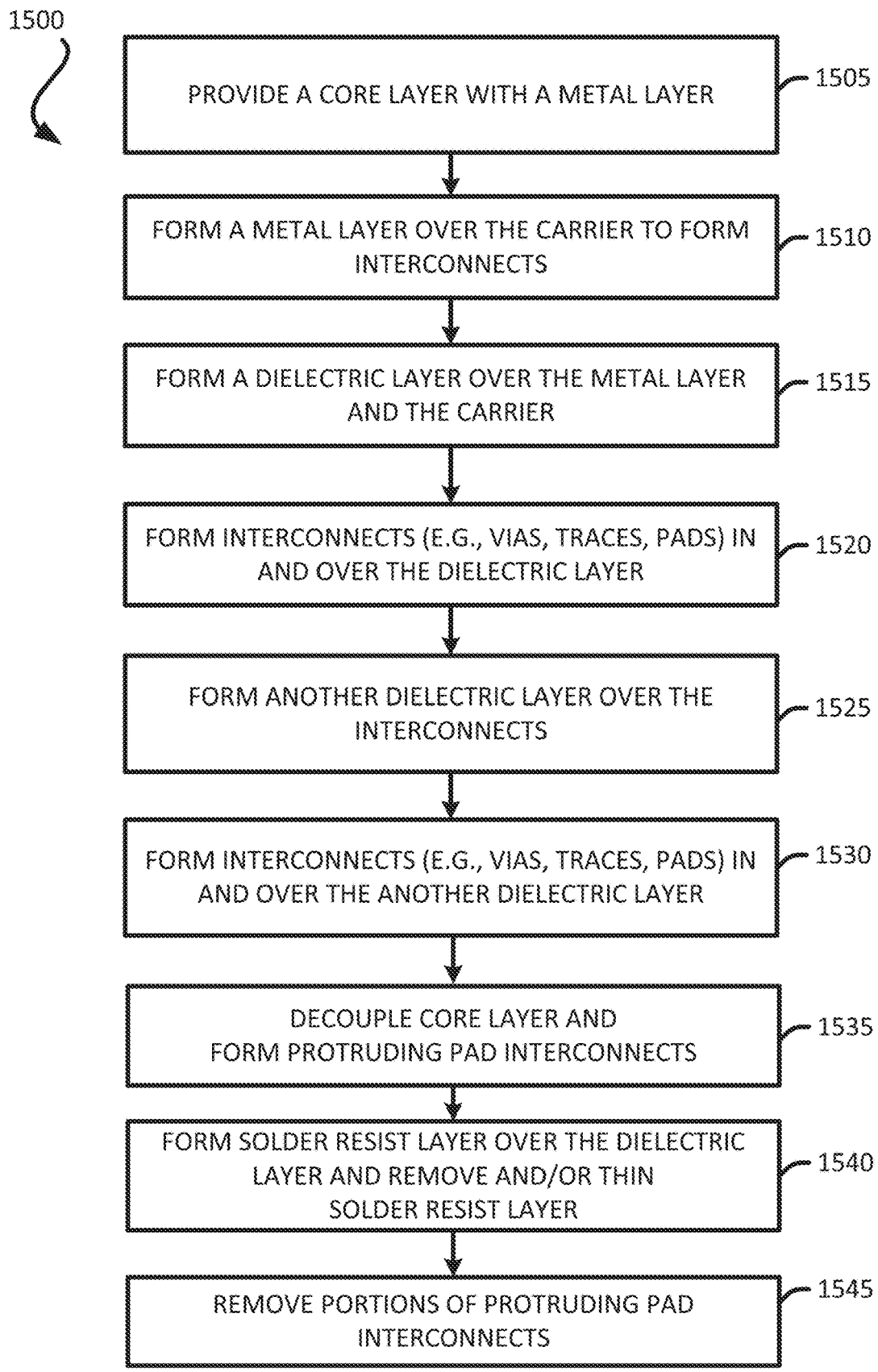
FIG. 15 illustrates an exemplary flow diagram of a method for fabricating a substrate.

Exemplary Flow Diagram of a Method for Fabricating a Substrate Comprising Protruding Pad Interconnects In some implementations, fabricating a substrate includes several processes. FIG. 15 illustrates an exemplary flow diagram of a method 1500 for providing or fabricating a substrate. In some implementations, the method 1500 of FIG. 15 may be used to provide or fabricate the substrate of FIG. 1. For example, the method of FIG. 15 may be used to fabricate the substrate 102. The method 1500 of FIG. 15 will be used to describe fabricating the substrate 302.

It should be noted that the method of FIG. 15 may combine one or more processes in order to simplify and/or clarify the method for providing or fabricating a substrate. In some implementations, the order of the processes may be changed or modified.

The method provides (at 1505) a core layer 1400 that includes a metal layer 1401. Different implementations may use different materials for the core layer. It is noted that the core layer is an example of a carrier that may be used. However, other carriers may be used. For example, the carrier may include a substrate, glass, quartz and/or carrier tape. Stage 1 of FIG. 14A illustrates and describes an example of a state after a core layer with a metal layer is provided.

The method forms (at 1510) a metal layer over the core layer 1400 and the metal layer 1401. The metal layer may be patterned to form interconnects 1402. A plating process may be used to form the metal layer and interconnects. Stage 2 of FIG. 14A illustrates and describes an example of a state after a metal layer and interconnects 1402 are formed.

The method forms (at 1515) a dielectric layer 1420 over the core layer 1400, the metal layer 1401 and the interconnects 1402. The dielectric layer 1420 may include polyimide. Forming the dielectric layer may also include forming a plurality of cavities (e.g., 1410) in the dielectric layer 1420. The plurality of cavities may be formed using an etching process (e.g., photo etching) or laser process. Stages 3-4 of FIG. 14A illustrate and describe an example of forming a dielectric layer and cavities in the dielectric layer.

The method forms (at 1520) interconnects in and over the dielectric layer. For example, the interconnects 1412 may be formed in and over the dielectric layer 1420. A plating process may be used to form the interconnects. Forming interconnects may include providing a patterned metal layer over and/or in the dielectric layer. Stage 5 of FIG. 14A illustrates and describes an example of forming interconnects in and over a dielectric layer.

The method forms (at 1525) a dielectric layer 1422 over the dielectric layer 1420 and the interconnects. The dielectric layer 1422 may include polyimide. Forming the dielectric layer may also include forming a plurality of cavities (e.g., 1430) in the dielectric layer 1422. The plurality of cavities may be formed using an etching process or laser process. Stages 6-7 of FIGS. 14A-14B illustrate forming a dielectric layer and cavities in the dielectric layer.

The method forms (at 1530) interconnects in and/or over the dielectric layer. For example, the interconnects 1414 may be formed. A plating process may be used to form the interconnects. Forming interconnects may include providing a patterned metal layer over an in the dielectric layer. Stage 8 of FIG. 14B illustrates and describes an example of forming interconnects in and over a dielectric layer.

The method may form additional dielectric layer(s) and additional interconnects as described at 1525 and 1530. Stages 9-11 of FIGS. 14B-14C illustrate and describe an example of forming additional interconnects in and over a dielectric layer.

Once all the dielectric layer(s) and additional interconnects are formed, the method may decouple (e.g., remove, grind out) (at 1535) the core layer (e.g., 1400) from the dielectric layer 1420, leaving the substrate. Stage 12 of FIG. 14C illustrates and describes an example of a substrate 102 after the decoupling a core layer.

The method may also form (at 1535) protruding pad interconnects by forming interconnects over pads. An etching process may be used to pattern the protruding pad interconnects. Stage 2 of FIG. 8 illustrates and describes an example of forming interconnects over pads.

The method may form (at 1540) solder resist layers (e.g., 140, 142) over the substrate. A lamination, coating, and/or exposure process may be used to form the solder resist layer. Stage 3 of FIG. 8 illustrates and describes an example of a state after forming solder resist layers.

The method may thin (at 1540) portions of the solder resist layer. For example, the solder resist layer 140 may be thinned entirely or thinned in select locations of the solder resist layer 140. How much a solder resist layer is thinned may vary with different implementations. In some implementations, a sand blasting process may be used to thin portions of a solder resist layer. Stage 4 of FIG. 8 illustrates and describes an example of a state after the thinning of a solder resist layer. Stage 4 of FIG. 10 illustrates and describes an example of a state after selective removal of a solder resist layer.

The method may remove (at 1545) portions of the protruding pad interconnects (e.g., 122a, 122b). Stage 5 of FIG. 8 illustrates and describes an example of removing portions of a protruding pad interconnects.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 16:
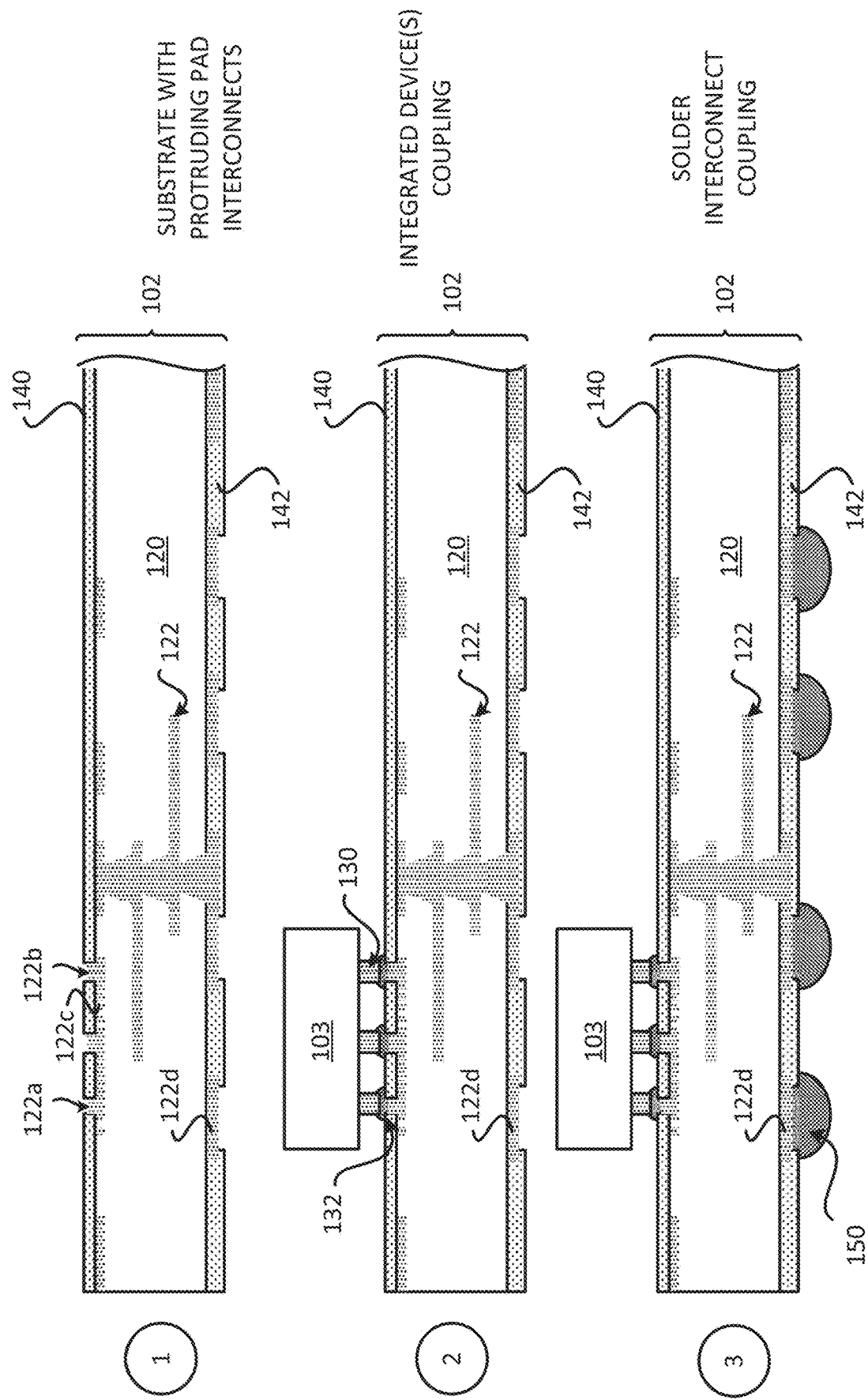
FIG. 16 illustrates an exemplary sequence for fabricating a package that includes a substrate comprising protruding pad interconnects.

Exemplary Sequence for Fabricating a Package that Includes a Substrate Comprising Protruding Pad Interconnects FIG. 16 illustrates an exemplary sequence for providing or fabricating a package that includes a substrate comprising protruding pad interconnects. In some implementations, the sequence of FIG. 16 may be used to provide or fabricate the package 100 that includes a substrate comprising protruding pad interconnects of FIG. 1, or any of the packages (e.g., 300, 400, 600) described in the disclosure.

It should be noted that the sequence of FIG. 16 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 16 may be used to fabricate one package or several packages at a time (as part of a wafer).

Stage 1, as shown in FIG. 16, illustrates a state after the substrate 102 is provided. The substrate 102 may be provided by a supplier or fabricated. A process similar to the process shown in FIGS. 14A-14C may be used to fabricate the substrate 102. However, different implementations may use different processes to fabricate the substrate 102. The substrate 102 includes at least one dielectric layer 120, and a plurality of interconnects 122. The plurality of interconnects 122 may include protruding pad interconnects (e.g., 122a, 122b). The substrate 102 may include an embedded trace substrate (ETS). In some implementations, the at least one dielectric layer 120 may include prepreg layers. In some implementations, instead of the substrate 102, another substrate may be provided, such as the substrate 402 or the substrate 602.

Stage 2 illustrates a state after the integrated device 103 is coupled to a first surface (e.g., top surface) of the substrate 102. The integrated device 103 may be coupled to the substrate 102 through a plurality of pillar interconnects 130 and a plurality of solder interconnects 132. The plurality of pillar interconnects 130 and the plurality of solder interconnects 132 are coupled to the plurality of protruding pad interconnects (e.g., 122a). A solder reflow process may be used to couple the integrated device 103 to the plurality of protruding pad interconnects through the plurality of pillar interconnects 130 and the plurality of solder interconnects 132. Some implementations may couple more than one integrated device to the substrate 102.

Stage 3 illustrates a state after a plurality of solder interconnects 150 is couped to the substrate 102. The plurality of solder interconnects 150 may be couple to interconnects (e.g., 122d) that are located over a second surface of the at least one dielectric layer 120. A solder reflow process may be used to couple the plurality of solder interconnects 150 to the substrate 102. Stage 3 may illustrate the package 100. The packages (e.g., 100) described in the disclosure may be fabricated one at a time or may be fabricated together as part of one or more wafers and then singulated into individual packages.

Figure 17:
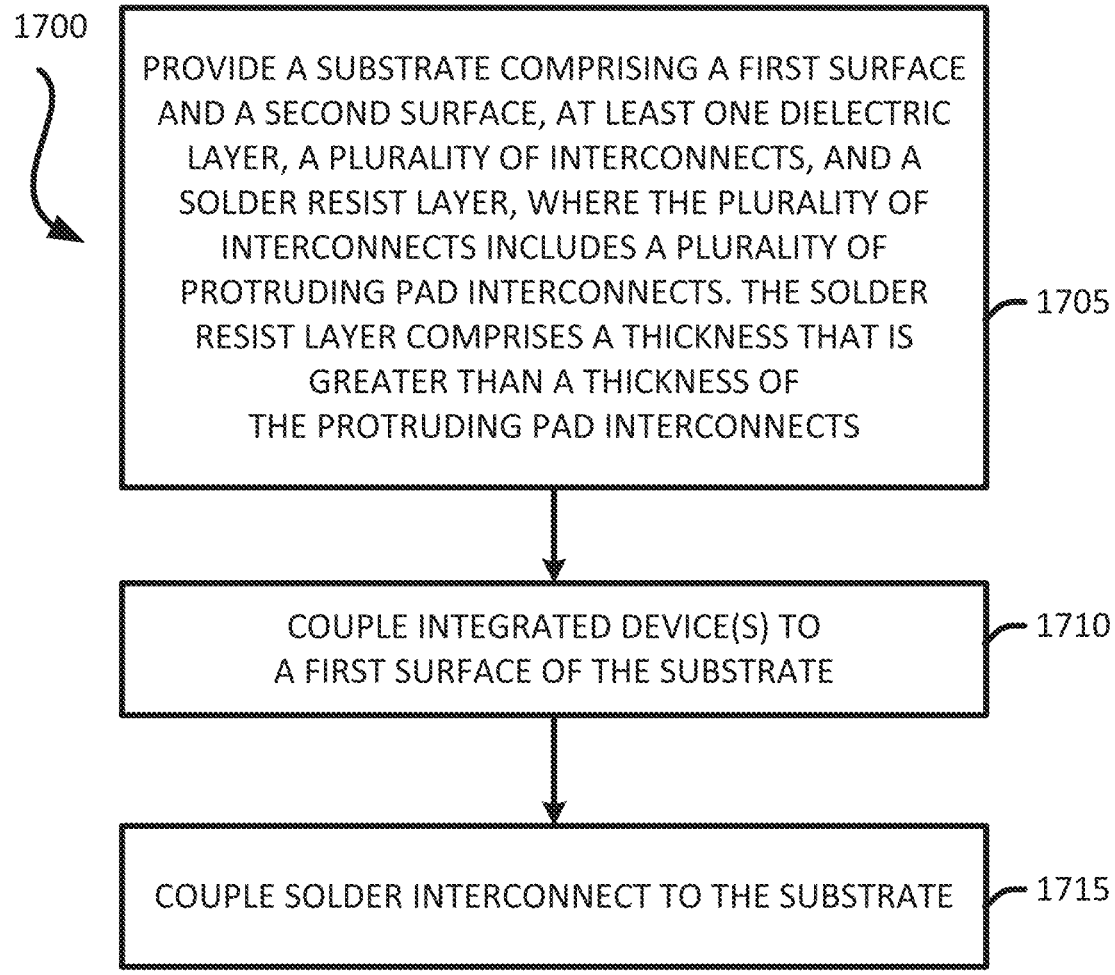
FIG. 17 illustrates an exemplary flow diagram of a method for fabricating a package that includes a substrate comprising protruding pad interconnects.

Exemplary Flow Diagram of a Method for Fabricating a Package that Includes a Substrate Comprising Protruding Pad Interconnects In some implementations, fabricating a package that includes a substrate comprising protruding pad interconnects includes several processes. FIG. 17 illustrates an exemplary flow diagram of a method 1700 for providing or fabricating a package that includes a substrate comprising protruding pad interconnects. In some implementations, the method 1700 of FIG. 17 may be used to provide or fabricate the package 100 of FIG. 1 described in the disclosure. However, the method 1700 may be used to provide or fabricate any of the packages (e.g., 300, 400, 600) described in the disclosure.

It should be noted that the method of FIG. 17 may combine one or more processes in order to simplify and/or clarify the method for providing or fabricating a package that includes a substrate comprising protruding pad interconnects. In some implementations, the order of the processes may be changed or modified.

The method provides (at 1705) a substrate (e.g., 102) with protruding pad interconnects. The substrate 102 may be provided by a supplier or fabricated. The substrate 102 includes at least one dielectric layer 120, and a plurality of interconnects 122. The plurality of interconnects 122 may include protruding pad interconnects. The substrate 102 may include an embedded trace substrate (ETS). In some implementations, the at least one dielectric layer 120 may include prepreg layers. Different implementations may provide different substrates. A process similar to the processes shown in FIGS. 14A-14D may be used to fabricate the substrate 102. However, different implementations may use different processes to fabricate the substrate 102. Stage 1 of FIG. 16 illustrates and describes an example of providing a substrate with protruding pad interconnects.

The method couples (at 1710) at least one integrated device (e.g., 103) to the first surface of the substrate (e.g., 102). For example, the integrated device 103 may be coupled to the substrate 102 through the plurality of pillar interconnects 130 and the plurality of solder interconnects 132. The plurality of pillar interconnects 130 and the plurality of solder interconnects 132 are coupled to the plurality of protruding pad interconnects (e.g., 122a). A solder reflow process may be used to couple the integrated device 103 to the plurality of protruding pad interconnects through the plurality of pillar interconnects 130 and the plurality of solder interconnects 132. Stage 2 of FIG. 16 illustrates and describes an example of an integrated device coupled to a substrate.

The method couples (at 1715) a plurality of solder interconnects (e.g., 150) to the second surface of the substrate (e.g., 102). A solder reflow process may be used to couple the plurality of solder interconnects to the substrate. Stage 3 of FIG. 16 illustrates and describes an example of coupling solder interconnects to the substrate.

Exemplary Electronic Devices

Figure 18:
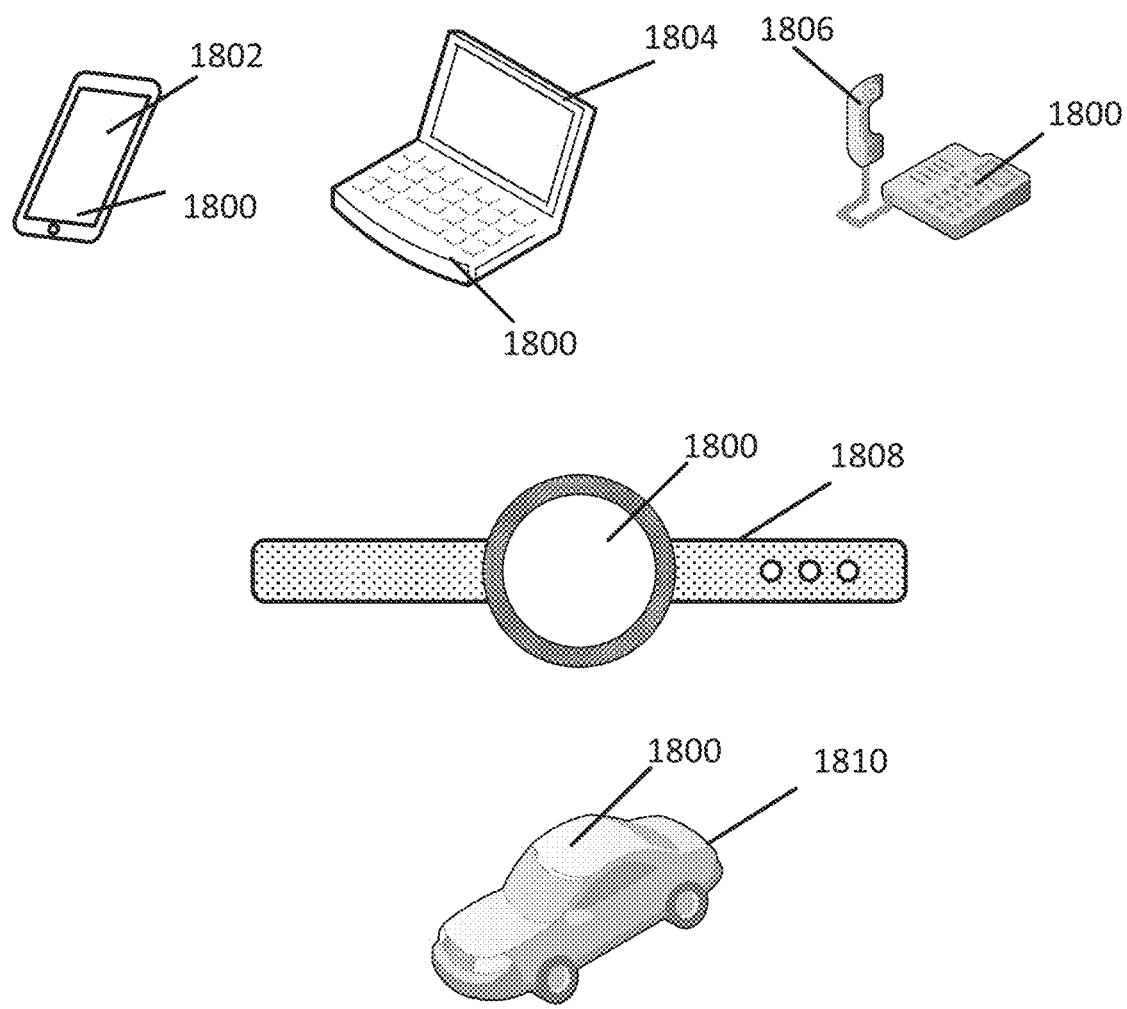
FIG. 18 illustrates various electronic devices that may integrate a die, an electronic circuit, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-11, 12A-12D, 13, 14A-14C, and/or 15-18 may be rearranged and/or combined into a single component, process, feature or function or embodied in several components, processes, or functions. Additional elements, components, processes, and/or functions may also be added without departing from the disclosure. It should also be noted FIGS. 1-11, 12A-12D, 13, 14A-14C, and/or 15-18 and its corresponding description in the present disclosure is not limited to dies and/or ICs. In some implementations, FIGS. 1-11, 12A-12D, 13, 14A-14C, and/or 15-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising: a substrate comprising: at least one dielectric layer; a plurality of interconnects comprising a plurality of protruding pad interconnects; and a solder resist layer located over the at least one dielectric layer, the solder resist layer comprising a thickness that is greater than a thickness of the plurality of protruding pad interconnects; and an integrated device coupled to the substrate.

Aspect 2: The package of aspect 1, wherein the plurality of protruding pad interconnects includes a first protruding pad interconnect comprising a first pad portion and a second pad portion coupled to the first pad portion.

Aspect 3: The package of aspect 2, wherein the first pad portion has a first width and the second pad portion has a second width Aspect 4: The package of aspect 3, wherein the first width is greater than the second width.

Aspect 5: The package of aspects 2 through 4, wherein the first pad portion is located in the at least one dielectric layer, and wherein the second pad portion is located over a surface of the at least one dielectric layer.

Aspect 6: The package of aspects 2 through 4, wherein the first pad portion and the second pad portion are located over a surface of the at least one dielectric layer.

Aspect 7: The package of aspects 2 through 6, wherein the first pad portion and the second pad portion are part of the same pad.

Aspect 8: The package of aspect 2 through 7, wherein the solder resist layer includes a first opening located over the first protruding pad interconnect.

Aspect 9: The package of aspect 8, wherein the first opening has a width that is equal or less than the width of the first pad portion.

Aspect 10: The package of aspect 8, wherein the first opening exposes only the second pad portion of the first protruding pad interconnect.

Aspect 11: The package of aspects 2 through 10, wherein the plurality of protruding pad interconnects includes a second protruding pad interconnect, wherein the second protruding pad interconnect is adjacent to the first protruding pad interconnect, and wherein a minimum pitch between the first protruding pad interconnect and the second protruding pad interconnect is about 80 micrometers.

Aspect 12: The package of aspects 2 through 11, wherein the first pad portion has a width in a range of about 40-48 micrometers, and wherein the second pad portion has a width in a range of about 10-40 micrometers.

Aspect 13: The package of aspects 1 through 12, further comprising a second integrated device coupled to the substrate.

Aspect 14: The package of aspect 13, wherein the first integrated device is configured to be coupled to the second integrated device through the plurality of protruding pad interconnects.

Aspect 15: The package of aspect 13, wherein the plurality of protruding pad interconnects includes a first plurality of protruding pad interconnects and a second plurality of protruding pad interconnects, and wherein the first integrated device is coupled to the first plurality of protruding pad interconnects, and wherein the second integrated device is coupled to the second plurality of protruding pad interconnects.

Aspect 16: The package of aspects 1 through 15, wherein the substrate includes an embedded trace substrate (ETS) or a cored substrate.

Aspect 17: An apparatus comprising: a substrate comprising: at least one dielectric layer; a plurality of interconnects comprising a plurality of protruding pad interconnects; and a solder resist layer located over the at least one dielectric layer, the solder resist layer comprising a thickness that is greater than a thickness of the plurality of protruding pad interconnects.

Aspect 18: The apparatus of aspect 17, wherein the plurality of protruding pad interconnects includes a first protruding pad interconnect comprising a first pad portion and a second pad portion coupled to the first pad portion.

Aspect 19: The apparatus of aspect 18, wherein the first pad portion has a first width and the second pad portion has a second width, and wherein the first width is greater than the second width.

Aspect 20: The apparatus of aspects 18 through 19, wherein the first pad portion is located in the at least one dielectric layer, and wherein the second pad portion is located over a surface of the at least one dielectric layer.

Aspect 21: The apparatus of aspects 18 through 19, wherein the first pad portion and the second pad portion are located over a surface of the at least one dielectric layer.

Aspect 22: The apparatus of aspects 18 through 21, wherein the first pad portion and the second pad portion are part of the same pad.

Aspect 23: The apparatus of aspects 18 through 22, wherein the solder resist layer includes a first opening located over the first protruding pad interconnect.

Aspect 24: The apparatus of aspect 23, wherein the first opening has a width that is equal or less than the width of the first pad portion.

Aspect 25: The apparatus of aspect 23, wherein the first opening exposes only the second pad portion of the first protruding pad interconnect.

Aspect 26: The apparatus of aspects 18 through 25, wherein the plurality of protruding pad interconnects includes a second protruding pad interconnect, wherein the second protruding pad interconnect is adjacent to the first protruding pad interconnect, and wherein a minimum pitch between the first protruding pad interconnect and the second protruding pad interconnect is about 80 micrometers.

Aspect 27: The apparatus of aspects 18 through 26, wherein the first pad portion has a width in a range of about 40-48 micrometers, and wherein the second pad portion has a width in a range of about 10-40 micrometers.

Aspect 28: The apparatus of aspects 17 through 27, wherein the substrate includes an embedded trace substrate (ETS) or a cored substrate.

Aspect 29: The method for fabricating a package, comprising: providing a substrate comprising: at least one dielectric layer; a plurality of interconnects comprising a plurality of protruding pad interconnects; and a solder resist layer located over the at least one dielectric layer, the solder resist layer comprising a thickness that is greater than a thickness of the plurality of protruding pad interconnects; and coupling an integrated device to the substrate.

Aspect 30: The method of aspect 29, wherein the plurality of protruding pad interconnects includes a first protruding pad interconnect comprising a first pad portion and a second pad portion coupled to the first pad portion.

Aspect 31: The method of aspect 30, wherein the first pad portion has a first width and the second pad portion has a second width.

Aspect 32: The method of aspect 31, wherein the first width is greater than the second width.

Aspect 33: The method of aspect 32, wherein the solder resist layer has an opening over the first protruding pad interconnect, and wherein the opening has an opening width that is equal or less than the first width.

Aspect 34: The method of aspect 32, wherein the solder resist layer has an opening over the first protruding pad interconnect, and wherein the opening has an opening width that is equal to the second width.

Aspect 35: The method of aspect 32, wherein the solder resist layer has an opening over the first protruding pad interconnect, wherein the opening has an opening width that is greater than the second width, and wherein the opening width is less than the first width.

Aspect 33: The package of aspects 4 through 8 and 10 through 16, wherein the solder resist layer has an opening over the first protruding pad interconnect, and wherein the opening has an opening width that is equal or less than the first width.

Aspect 34: The package of aspects 4 through 8 and 10 through 16, wherein the solder resist layer has an opening over the first protruding pad interconnect, and wherein the opening has an opening width that is equal to the second width.

Aspect 35: The package of aspects 4 through 8 and 10 through 16, wherein the solder resist layer has an opening over the first protruding pad interconnect, wherein the opening has an opening width that is greater than the second width, and wherein the opening width is less than the first width.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
at least one dielectric layer;
a plurality of interconnects comprising a plurality of protruding pad interconnects; and
a solder resist layer located over the at least one dielectric layer, the solder resist layer comprising a thickness that is greater than a thickness of the plurality of protruding pad interconnects;
wherein the plurality of protruding pad interconnects includes a first protruding pad interconnect comprising a first pad portion and a second pad portion coupled to the first pad portion, the first pad portion is centered directly underneath the second pad portion and located in the at least one dielectric layer; and
a first integrated device coupled to the substrate.

2. The package of claim 1, wherein the first pad portion has a first width and the second pad portion has a second width.

3. The package of claim 2, wherein the first width is greater than the second width.

4. The package of claim 1,
wherein the second pad portion is located over a surface of the at least one dielectric layer.

5. The package of claim 1, wherein the first pad portion and the second pad portion are part of the same pad.

6. The package of claim 1, wherein the solder resist layer includes a first opening located over the first protruding pad interconnect.

7. The package of claim 6, wherein the first opening has a width that is equal or less than the width of the first pad portion.

8. The package of claim 6, wherein the first opening exposes only the second pad portion of the first protruding pad interconnect.

9. The package of claim 1,
wherein the plurality of protruding pad interconnects includes a second protruding pad interconnect,
wherein the second protruding pad interconnect is adjacent to the first protruding pad interconnect, and
wherein a minimum pitch between the first protruding pad interconnect and the second protruding pad interconnect is about 80 micrometers.

10. The package of claim 1,
wherein the first pad portion has a width in a range of about 40-48 micrometers, and
wherein the second pad portion has a width in a range of about 10-40 micrometers.

11. The package of claim 1, further comprising a second integrated device coupled to the substrate.

12. The package of claim 11, wherein the first integrated device is configured to be coupled to the second integrated device through the plurality of protruding pad interconnects.

13. The package of claim 11,
wherein the plurality of protruding pad interconnects includes a first plurality of protruding pad interconnects and a second plurality of protruding pad interconnects, and
wherein the first integrated device is coupled to the first plurality of protruding pad interconnects, and
wherein the second integrated device is coupled to the second plurality of protruding pad interconnects.

14. The package of claim 1, wherein the substrate includes an embedded trace substrate (ETS) or a cored substrate.

15. The package of claim 1, wherein the first pad portion has a topside facing the second pad portion and a backside facing opposite the second pad portion, wherein the backside directly touches the dielectric.

16. The package of claim 15, wherein the first pad portion has side walls on the sides of the first pad portion that are between the topside and the backside, the side walls directly touching the dielectric.

17. The package of claim 1, wherein the first pad portion has only a single width.

18. An apparatus comprising:
a substrate comprising:
at least one dielectric layer;
a plurality of interconnects comprising a plurality of protruding pad interconnects;
a solder resist layer located over the at least one dielectric layer, the solder resist layer comprising a thickness that is greater than a thickness of the plurality of protruding pad interconnects;
wherein the plurality of protruding pad interconnects includes a first protruding pad interconnect comprising a first pad portion and a second pad portion coupled to the first pad portion; and
wherein the first pad portion is centered directly underneath the second pad portion and located in the at least one dielectric layer.

19. The apparatus of claim 18,
wherein the first pad portion has a first width and the second pad portion has a second width, and
wherein the first width is greater than the second width.

20. The apparatus of claim 18,
wherein the second pad portion is located over a surface of the at least one dielectric layer.

21. The apparatus of claim 18, wherein the first pad portion and the second pad portion are part of the same pad.

22. The apparatus of claim 18, wherein the solder resist layer includes a first opening located over the first protruding pad interconnect.

23. The apparatus of claim 22, wherein the first opening has a width that is equal or less than the width of the first pad portion.

24. The apparatus of claim 22, wherein the first opening exposes only the second pad portion of the first protruding pad interconnect.

25. The apparatus of claim 18,
wherein the plurality of protruding pad interconnects includes a second protruding pad interconnect,
wherein the second protruding pad interconnect is adjacent to the first protruding pad interconnect, and
wherein a minimum pitch between the first protruding pad interconnect and the second protruding pad interconnect is about 80 micrometers.

26. The apparatus of claim 18,
wherein the first pad portion has a width in a range of about 40-48 micrometers, and
wherein the second pad portion has a width in a range of about 10-40 micrometers.

27. The apparatus of claim 18, wherein the substrate includes an embedded trace substrate (ETS) or a cored substrate.

28. The package of claim 18, wherein the first pad portion has a topside facing the second pad portion and a backside facing opposite the second pad portion, wherein the backside directly touches the dielectric.

29. The method for fabricating a package, comprising:
providing a substrate comprising:
   at least one dielectric layer;
   a plurality of interconnects comprising a plurality of protruding pad interconnects; and
   a solder resist layer located over the at least one dielectric layer, the solder resist layer comprising a thickness that is greater than a thickness of the plurality of protruding pad interconnects;
wherein the plurality of protruding pad interconnects includes a first protruding pad interconnect comprising a first pad portion and a second pad portion coupled to the first pad portion, wherein the first pad portion is centered directly underneath the second pad portion and located in the at least one dielectric layer; and
wherein the solder resist layer has an opening over the first protruding pad interconnect;
coupling an integrated device to the substrate.

30. The method of claim 29, wherein the first pad portion has a first width and the second pad portion has a second width.

31. The method of claim 30, wherein the first width is greater than the second width.

32. The method of claim 31,
wherein the solder resist layer has an opening over the first protruding pad interconnect, and
wherein the opening has an opening width that is equal or less than the first width.

33. The method of claim 31,
wherein the opening has an opening width that is equal to the second width.

34. The method of claim 31,
wherein the solder resist layer has an opening over the first protruding pad interconnect,
wherein the opening has an opening width that is greater than the second width, and wherein the opening width is less than the first width.

* * * * *